(12) United States Patent
Kim et al.

(10) Patent No.: US 7,796,228 B2
(45) Date of Patent: Sep. 14, 2010

(54) DISPLAY SUBSTRATE, METHOD OF MANUFACTURING THE SAME AND DISPLAY DEVICE HAVING THE SAME

(75) Inventors: Hyun-Young Kim, Suwon-si (KR); Kwan-Wook Jung, Suwon-si (KR); Seung-Gyu Tae, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 286 days.

(21) Appl. No.: 12/035,556

(22) Filed: Feb. 22, 2008

(65) Prior Publication Data

US 2008/0203392 A1 Aug. 28, 2008

(30) Foreign Application Priority Data

Feb. 22, 2007 (KR) .................. 10-2007-0017967
May 4, 2007 (KR) .................. 10-2007-0043674

(51) Int. Cl.
*G02F 1/1345* (2006.01)
*H01L 27/13* (2006.01)
*H01L 23/522* (2006.01)
*H01L 21/768* (2006.01)

(52) U.S. Cl. .............. 349/149; 349/122; 349/187; 257/59; 257/759; 257/E27.113; 257/E23.167; 257/E23.145; 257/E21.584; 257/E21.582; 438/623; 438/29; 438/30

(58) Field of Classification Search ............. 349/149, 349/122, 138, 139, 42, 43, 46, 142, 143, 349/158, 187, 191; 438/29, 30, 623; 257/59, 257/759, E27.113, E23.167, E23.145, E21.584, 257/E21.582

See application file for complete search history.

(56) References Cited

U.S. PATENT DOCUMENTS

| 6,506,978 | B1* | 1/2003 | Furihata | 174/254 |
| 6,698,077 | B2* | 3/2004 | Buchwalter et al. | 29/423 |
| 7,214,555 | B2* | 5/2007 | Yamazaki et al. | 438/30 |
| 7,483,091 | B1* | 1/2009 | Yamazaki et al. | 349/45 |
| 7,636,145 | B2* | 12/2009 | Jung et al. | 349/149 |
| 2008/0203392 | A1* | 8/2008 | Kim et al. | 257/59 |

FOREIGN PATENT DOCUMENTS

| JP | 06260533 | 9/1994 |
| JP | 2000294598 | 10/2000 |
| JP | 2001085083 | 3/2001 |
| KR | 1020030086812 | 11/2003 |

* cited by examiner

*Primary Examiner*—Brian M Healy
(74) *Attorney, Agent, or Firm*—Cantor Colburn LLP

(57) ABSTRACT

A display substrate includes a base substrate having a display area and a peripheral area which surrounds the display area, a pixel electrode formed on the display area, a pad part formed on the peripheral area, an adhesion part formed on the peripheral area and having a plurality of holes formed in an area adjacent to the pad part on the peripheral area and a conductive adhesion member formed on the pad part and the adhesion part to make electrical contact with the pad part and a terminal of an integrated circuit.

65 Claims, 17 Drawing Sheets

DISPLAY SUBSTRATE, METHOD OF MANUFACTURING THE SAME AND DISPLAY DEVICE HAVING THE SAME

This application claims priority to Korean Patent Application No. 2007-17967, filed on Feb. 22, 2007, and Korean Patent Application No. 2007-43674, filed on May 4, 2007, and all the benefits accruing therefrom under 35 U.S.C. §119, the contents of which in their entireties are herein incorporated by reference.

BACKGROUND OF THE INVENTION

1. Field of the Invention

The present invention relates to a display substrate, a method of manufacturing the display substrate and a display device having the display substrate. More particularly, the present invention relates to a display substrate having an enhanced reliability, a method of manufacturing the display substrate and a display device having the display substrate.

2. Description of the Related Art

Generally, a display device includes a display panel and a driving circuit which drives the display panel. The display panel includes an array substrate. The array substrate includes a plurality of gate lines, a plurality of data lines and a plurality of pixel parts defined by the gate lines and the data lines. The driving circuit includes a gate driving circuit which provides the plurality of gate lines with a gate signal and a source driving circuit which provides the plurality of data lines with a data signal.

The gate driving circuit and the source driving circuit may be mounted on the array substrate in a chip. In a common current practice, the gate driving circuit is directly formed on the array substrate in order to manufacture display devices having desirable characteristics such as being thin, for example. Further, in order to prevent corrosion of the gate driving circuit, a relatively thick organic layer is formed over the gate driving circuit on the array substrate.

To mount the source driving circuit on the array substrate, a plurality of pads is formed on the array substrate. Individual pads of plurality of pads are electrically connected to a lower metal layer through contact holes formed in the organic layer.

In a panel drop test process of the display panel including the array substrate, a protection layer is removed from the array substrate due to a weak adhesion force between the organic layer and the protection layer on the lower metal layer. In addition, the source driving circuit is removed along with the protection layer. As a result, a contact defect forms between the source driving circuit and the pads, thereby reducing a driving reliability of the source driving circuit.

BRIEF SUMMARY OF THE INVENTION

The present invention provides a display substrate having enhanced reliability, a method of manufacturing the display substrate and a display device having the display substrate.

In one exemplary embodiment of the present invention, a display substrate includes a base substrate having a display area and a peripheral area which surrounds the display area, a pixel electrode formed on the display area, a pad part formed on the peripheral area, an adhesion part formed on the peripheral area and having a plurality of holes formed in an area adjacent to the pad part on the peripheral area and a conductive adhesion member formed on the pad part and the adhesion part to make electrical contact with the pad part and a terminal of an integrated circuit.

The display substrate may further include an organic layer formed below the pixel electrode, a first insulation layer formed on the base substrate and an organic layer formed on the first insulation layer.

Individual holes of the plurality of holes are formed through a portion of the organic layer in the peripheral area and the conductive adhesion member is adhered to the first insulation layer exposed through the individual holes.

A second insulation layer may be formed on the base substrate.

Further, individual holes of the plurality of holes may be formed through a portion of the organic layer and the first insulation layer formed in the peripheral area, and the conductive adhesion member may be adhered to the second insulation layer exposed through the individual holes.

Alternatively, individual holes of the of plurality of holes are formed by a simultaneous patterning of the organic layer and the first insulation layer formed in the peripheral area and the display substrate further includes a dummy pattern exposed by each of the individual holes.

The display substrate may further include a switching element including a channel layer electrically connected to the pixel electrode formed from a first metal layer, and a source electrode and a drain electrode formed from a second metal layer.

The dummy pattern is formed by a patterning of the channel layer, or in alternative exemplary embodiments, by a patterning of the second metal layer.

Further, the dummy pattern may be a multilayer structure formed by a patterning of the channel layer and a patterning of the second metal layer.

The display substrate may further include a stepped compensation pattern formed on the base substrate, wherein the stepped compensation pattern is formed by a patterning of the first metal layer.

Individual holes of the plurality of holes are formed by a simultaneous patterning of a portion of the organic layer formed in the peripheral area, the first insulation layer and the second insulation layer, and the conductive adhesion member is adhered to the second insulation layer exposed through the individual holes.

The pixel electrode includes a transparent electrode and a reflective electrode, and the organic layer may be formed over the reflective electrode.

In alternative exemplary embodiments, the organic layer has a concave pattern and a convex pattern formed thereon.

Further, a first portion of the organic layer having a first thickness may be formed in the peripheral area having the pad part, a second portion of the organic layer having a second thickness may be formed in the display area having the pixel electrode formed thereon, and the second thickness of the second portion of the organic layer may be greater than the first thickness of the first portion of the organic layer.

The display substrate may further include a gate circuit section formed on the peripheral area, and a portion of the organic layer formed on the peripheral area may cover the gate circuit section.

In another exemplary embodiment of the present invention, a display substrate includes a base substrate having a display area and a peripheral area which surrounds the display area, a pixel electrode formed on the display area, a pad part formed on the peripheral area and a circuit part formed on the peripheral area and having a plurality of holes formed in an area adjacent to the pad part on the peripheral area. The circuit part has an integrated circuit ("IC") mounted on the circuit part.

The display substrate further includes a first insulation layer formed on the base substrate, an organic layer formed on the first insulation layer and a first insulation layer formed between the organic layer and the base substrate.

Individual holes of the plurality of holes are formed through a portion of the organic layer in the peripheral area.

A second insulation layer may be formed on the base substrate.

Individual holes of the plurality of holes are formed through a portion of the organic layer and the first insulation layer formed in the peripheral area.

A dummy pattern may be exposed by each of the holes.

The display substrate may further include a switching element including a channel layer electrically connected to the pixel electrode formed from a first metal layer, and a source electrode and a drain electrode formed from a second metal layer.

The dummy pattern is formed by a patterning of the channel layer or a patterning of the second metal layer.

The dummy pattern may have a multilayer structure and be formed by a patterning of the channel layer and a patterning of the second metal layer.

The display substrate may further include a stepped compensation pattern formed on the base substrate formed by a patterning of the first metal layer.

Individual holes of the plurality of holes are formed by a simultaneous patterning of the organic layer formed in the peripheral area, the first insulation layer and the second insulation layer.

The pixel electrode includes a transparent electrode and a reflective electrode, and the organic layer is formed over the reflective electrode.

The organic layer has a concave pattern and a convex pattern formed thereon.

A first portion of the organic layer having a first thickness is formed in the peripheral area having the pad part, a second portion of the organic layer having a second thickness is formed in the display area having the pixel electrode formed thereon, and the second thickness of the second portion of the organic layer is greater than the first thickness of the first portion of the organic layer.

A gate circuit section may be formed on the peripheral area. A portion of the organic layer formed on the peripheral area covers the gate circuit section.

In still another exemplary embodiment of the present invention, in a method of manufacturing a display substrate, a base substrate is formed, a switching element is formed in a display area of the base substrate and a pad pattern is formed in a peripheral area surrounding the display area. Then, an organic layer is formed on the base substrate and the organic layer is patterned to form an adhesion part in an area adjacent to the pad pattern. The adhesion part has a plurality of holes formed therein. Then, a pixel electrode is formed and is electrically connected to the switching element and a pad electrode electrically connected to the pad pattern. Then, a conductive adhesion member is formed on the pad electrode and the adhesion part. The conductive adhesion member makes electrical contact with the pad electrode and a terminal of an IC.

A first insulation layer may be formed on the base substrate.

The conductive adhesion member is adhered to the first insulation layer exposed through individual holes of the plurality of holes.

A second insulation layer may be formed on the base substrate.

The forming the adhesion part includes simultaneously patterning the organic layer and the first insulation layer.

The conductive adhesion member adheres to the second insulation layer exposed through the holes.

A gate circuit part may be formed in the peripheral area.

Forming the organic layer forms a portion of the organic layer to cover the gate circuit section.

In yet another exemplary embodiment of the present invention, a display device includes a display panel. The display panel includes: a base substrate; a display substrate formed on the base substrate and having a display area and a peripheral area; an opposing substrate facing the display substrate; a pixel electrode formed on the display area; a pad part formed on the peripheral area; and an adhesion part formed on the peripheral area and having a plurality of holes formed in an area adjacent to the pad part on the peripheral area.

The display device further includes a conductive member formed on the pad part and the adhesion part and an integrated circuit electrically connected to the pad part through the conductive member.

The display substrate further includes a first insulation layer formed on the base substrate and a first organic layer formed below the pixel electrode on the first insulation layer.

Individual holes of the plurality of holes are formed through a portion of the first organic layer in the peripheral area, and the conductive adhesion member is adhered to the first insulation layer exposed through the individual holes.

A second insulation layer may be formed on the base substrate.

The individual holes of the plurality of holes are formed through a portion of the first organic layer in the peripheral area and a portion of the first insulation layer, and the conductive adhesion member is adhered to the second insulation layer exposed through the individual holes.

The holes may be formed by a simultaneous patterning of the first organic layer formed in the peripheral area and the first insulation layer, and the display substrate may further include a dummy pattern exposed by each of the individual holes.

The display device may further include a switching element including a channel layer electrically connected to the pixel electrode formed from a first metal layer, and a source electrode and a drain electrode formed from a second metal layer.

The dummy pattern is formed by a patterning of the channel layer or by a patterning of the second metal layer.

The dummy pattern may be a multilayer structure formed through a patterning of the channel layer and the second metal layer.

A stepped compensation pattern may be formed on the base substrate.

The stepped compensation pattern may be formed by a patterning of the first metal layer.

The individual holes of the plurality of holes are formed by a simultaneous patterning of the organic layer formed in the peripheral area, the first insulation layer and the second insulation layer, and the conductive adhesion member is adhered to the second insulation layer exposed through the individual holes.

The pixel electrode comprises a transparent electrode and a reflective electrode. The first organic layer may be formed over the reflective electrode.

The first organic layer may have a concave pattern and a convex pattern formed thereon.

The color filter layer has a light hole formed therein, wherein the light hole is formed over the reflective electrode.

The opposing substrate may further include a second organic layer formed over the reflective electrode of the pixel electrode on the display area of the display substrate.

A first portion of the first organic layer having a first thickness is formed in the peripheral area having the pad part, a second portion of the organic layer having a second thickness is formed in the display area having the pixel electrode formed thereon, and the second thickness of the second portion of the first organic layer is greater than the first thickness of the first portion of the first organic layer.

In the display substrate, the method of manufacturing the display substrate and the display device having the display substrate according to exemplary embodiments of the present invention, the adhesion part is formed adjacent to the pad part, so that an adhesion force between the pad part and a terminal of an IC mounted on the pad part may be enhanced.

BRIEF DESCRIPTION OF THE DRAWINGS

The above and other aspects, features and advantages of the present invention will become more apparent by describing in further detail exemplary embodiments thereof with reference to the accompanying drawings, in which.

DETAILED DESCRIPTION OF THE INVENTION

Figure 1:
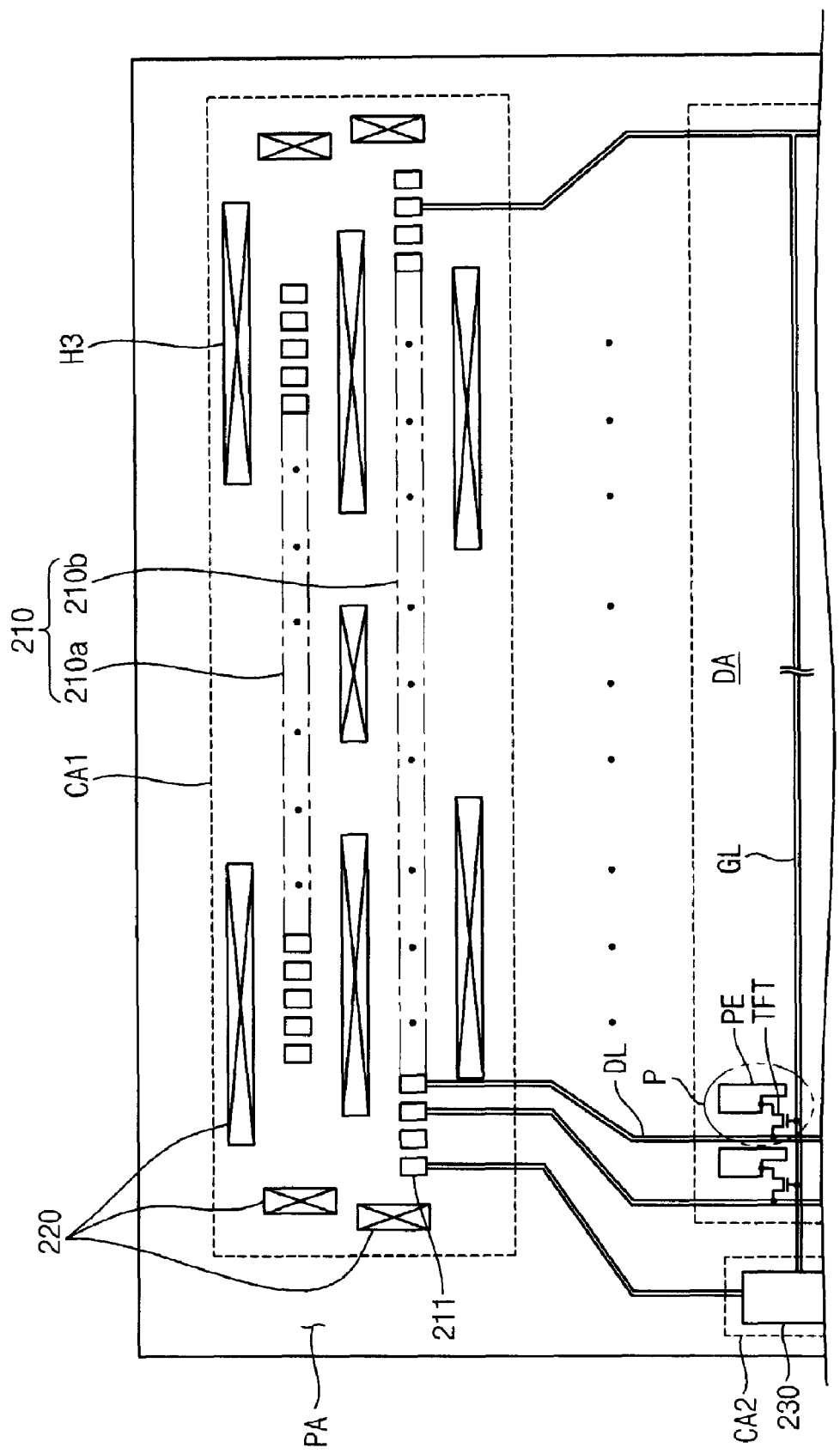
FIG. 1 is a plan view of a display substrate according to a first exemplary embodiment of the present invention.

The invention will now be described more fully hereinafter with reference to the accompanying drawings, in which exemplary embodiments of the invention are shown. The present invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," or "includes" and/or "including," when used in this specification, specify the presence of stated features, regions, integers, steps, operations, elements and/or components, but do not preclude the presence or addition of one or more other features, regions, integers, steps, operations, elements, components and/or groups thereof.

Furthermore, relative terms, such as "lower" or "bottom" and "upper" or "top" may be used herein to describe one element's relationship to other elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on the "upper" side of the other elements. The exemplary term "lower" can, therefore, encompass both an orientation of "lower" and "upper," depending upon the particular orientation of the figure. Similarly, if the device in one of the figures were turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning which is consistent with their meaning in the context of the relevant art and the present disclosure, and will not be interpreted in an idealized or overly formal sense unless expressly so defined herein.

Exemplary embodiments of the present invention are described herein with reference to cross section illustrations which are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes which result, for example, from manufacturing. For example, a region illustrated or described as flat may, typically, have rough and/or nonlinear features. Moreover, sharp angles which are illustrated may be rounded. Thus, the regions illustrated in the figures are schematic in nature and their shapes are not intended to illustrate the precise shape of a region and are not intended to limit the scope of the present invention.

Hereinafter, the exemplary embodiments of the present invention will be described in further detail with reference to the accompanying drawings.

FIG. 1 is a plan view of a display substrate according to a first exemplary embodiment of the present invention.

Referring to FIG. 1, a display substrate includes a display area DA and a peripheral area PA surrounding the display area DA. A plurality of gate lines GL and a plurality of data lines DL are formed in the display area DA. The gate lines GL cross the data lines DL to define a substantially matrix pattern. In one exemplary embodiment, the gate lines GL and the data lines DL define a plurality of pixel parts P on the display substrate; however, the plurality of pixel parts P may be defined in a different manner in alternative exemplary embodiments.

Each pixel P of the plurality of pixel parts P includes a switching element TFT electrically connected to the a respective gate line GL of the plurality of gate lines GL and a respective data line of the plurality of data lines DL and a pixel electrode PE electrically connected to the switching element TFT.

The peripheral area PA includes a first circuit area CA1 disposed at an end portion of the data lines DL and a second circuit area CA2 disposed at an end portion of the gate lines GL.

A pad part 210 and an adhesion part 220 are disposed on a surface of the first circuit area CA1. The pad part 210 includes a plurality of pads 211. Further, the pad part 210 includes an input pad 210a electrically connected to an input terminal of a source integrated circuit ("IC") (not shown) and an output pad 210b electrically connected to an output terminal (not shown). The output pad part 210b is electrically connected to the data lines DL to apply a data signal to the data lines DL.

The adhesion part 220 includes a plurality of holes formed adjacent to the pad part 210. The adhesion part 220 enhances an adhesion force between the pad part 210 and the source IC (not shown) and enhances an adhesion force between the source IC and the display substrate.

A gate circuit section 230 may be directly formed on the display substrate in the second circuit area CA2. The gate circuit section 230 may include a shift register having a plurality of switching elements electrically connected to each other, and applies a gate signal to the gate lines GL.

Figure 2:
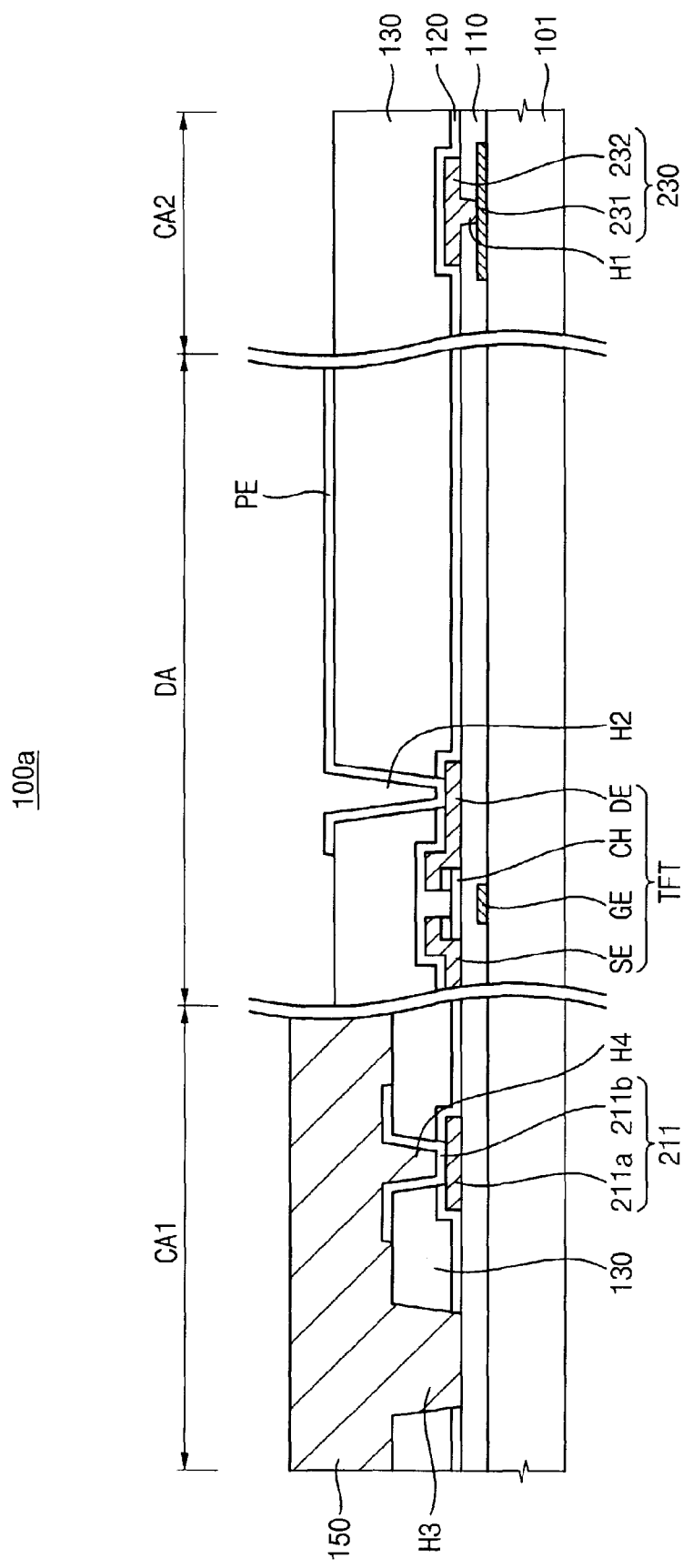
FIG. 2 is a partial cross-sectional view of the display substrate of FIG. 1 according to the first exemplary embodiment of the present invention.

FIG. 2 is a partial cross-sectional view of the display substrate of FIG. 1 according to the first exemplary embodiment of the present invention.

Referring to FIGS. 1 and 2, a display substrate 100a according to the first exemplary embodiment of the present invention includes a base substrate 101. The display substrate 100a further includes the display area DA and the peripheral area PA which surrounds the display area DA, as described above.

Likewise, the peripheral area PA includes the first circuit area CA1 and the second circuit area CA2.

A first metal pattern (not fully shown) is formed on the base substrate 100a. The first metal pattern includes the plurality of gate lines GL formed in the display area DA, a gate electrode GE of the switching element TFT, and a gate metal pattern 231 of the gate circuit section 230 formed in the second circuit area CA2.

A gate insulation layer 110 is formed on the base substrate 101 having the first metal pattern formed thereon, and a channel part CH is formed on the gate insulation layer 110 of the gate electrode GE. The channel part CH includes an activation layer having amorphous silicon ("a-Si") and an ohmic contact layer having n+ amorphous silicon ("n+ a-Si") which is formed by implanting n+ impurities at a high concentration into a-Si. A first hole H1 is formed in the gate insulation layer 110 on the gate metal pattern 231.

A second metal pattern (not fully shown) is formed on the base substrate 101 having the channel part CH formed thereon. The second metal pattern (not fully shown) includes the plurality of data lines DL formed in the display area DA, source electrode SE of the switching element TFT, drain electrodes DE of the switching element TFT, a pad pattern 211a formed in the first circuit area CA1, and a source metal pattern 232 of the gate circuit section 230 formed in the second circuit area CA2. The source metal pattern 232 makes electrical contact with the gate metal pattern 231 through the first hole H1.

A protective insulation layer 120 and an organic layer 130 are formed on the base substrate 101 having the second metal pattern formed thereon. The organic layer 130 is formed over the gate circuit section 230 to prevent corrosion of the gate circuit section 230, thereby enhancing a driving reliability of the gate circuit section 230.

A second hole H2 exposing a portion of the drain electrode DE is formed in the protective insulation layer 120 and the organic layer 130, and a third hole H3 for forming the adhesion part 220 and a fourth hole H4 exposing the pad pattern 211a are formed in the first circuit area CA1. The third hole H3 of the adhesion part 220 may expose the gate insulation layer 110 by a patterning of the organic layer 130 and the protective insulation layer 120. In alternative exemplary embodiments, the third hole H3 may expose the protective insulation layer 120 by a patterning of only the organic layer 130. Further, a first portion of the organic layer 130 corresponding to the first circuit area CA1 may have a first thickness thinner than a second thickness of a second portion of the organic layer 130 corresponding to the display area DA to minimize a stepped portion of the third hole H3 and the fourth hole H4.

The pixel electrode PE electrically connected to the drain electrode DE through the second hole H2 is formed in the display area DA, and a pad electrode 211b electrically connected to the pad pattern 211a through the fourth hole H4 is formed in the first circuit area CA1. A pad 211 including the pad pattern 211a and the pad electrode 211b is formed in the first circuit area CA1.

A conductive adhesion member 150 is formed in the first circuit area CA1, which has a source IC (not shown) mounted thereon and is electrically connected to the source IC and the pad part 210. The conductive adhesion member 150 may include, for example, an anisotropic conductive film ("ACF"), but is not limited thereto. The conductive adhesion member 150 is inserted into a plurality of the third holes H3 of the adhesion part 220 to directly make contact with the gate insulation layer 110 or the protective insulation layer 120.

Therefore, an adhesion force between the conductive adhesion member 150 and the base substrate 101 is enhanced due to the conductive adhesion member 150 making direct contact with the base substrate 101 through the plurality of third holes H3 of the adhesion part 220. Accordingly, the conductive adhesion member 150 is prevented from being removed from the base substrate 101. As a result, an adhesion force between the source IC mounted in the first circuit area CA1 and the pad part 210 is enhanced, thereby improving driving reliability.

Figure 3A:
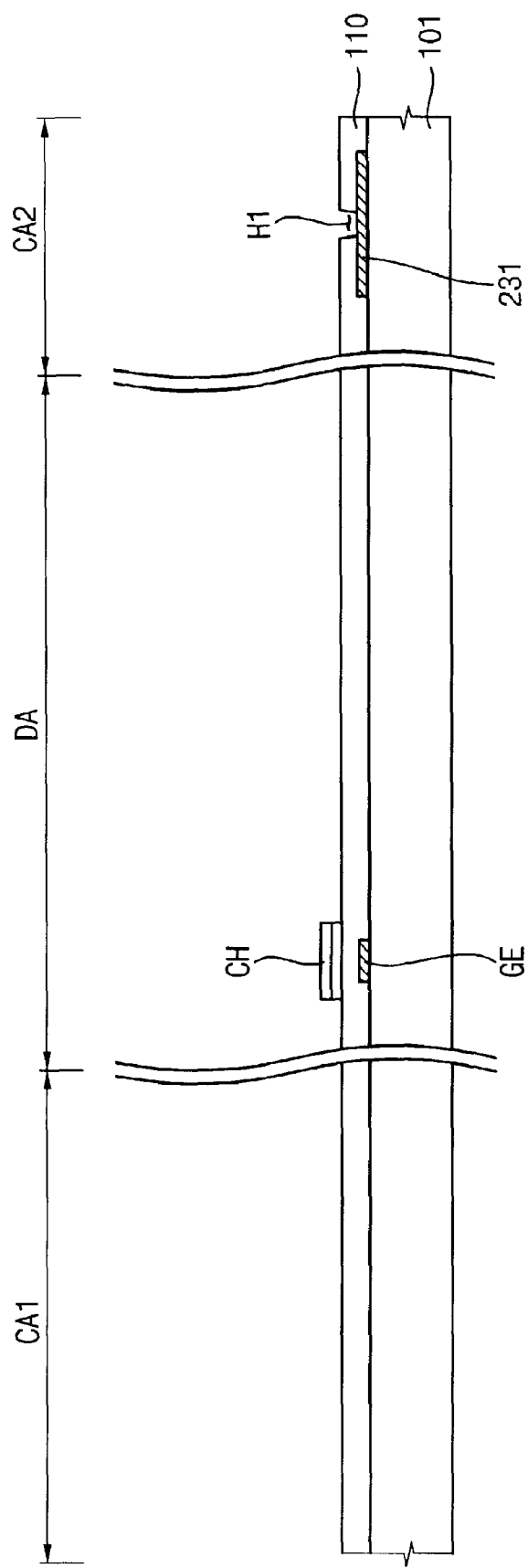
FIGS. 3A, 3B and 3C are partial cross-sectional views illustrating a method of manufacturing the display substrate of FIG. 2 according to the first exemplary embodiment of the present invention.
Figure 3B:
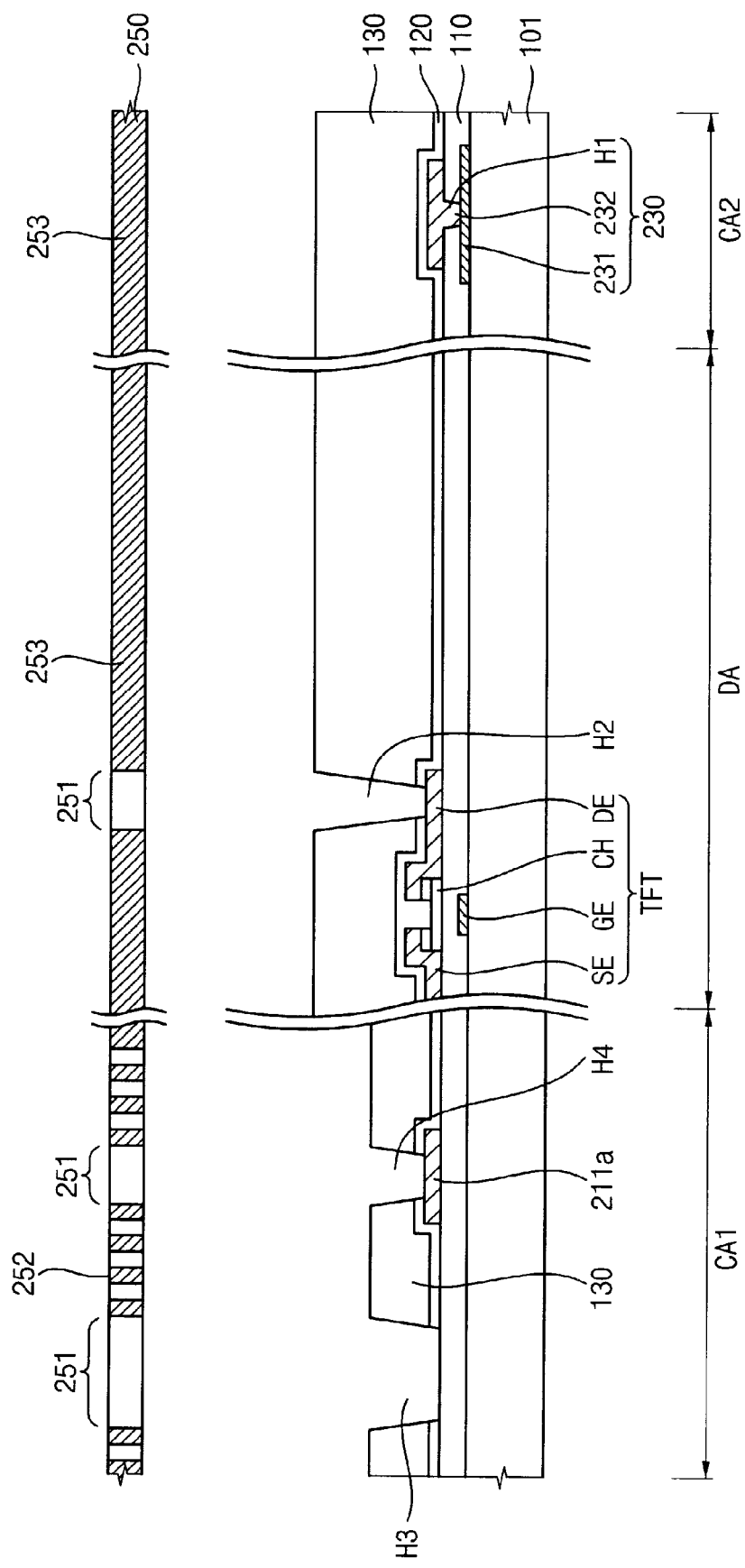
Figure 3C:
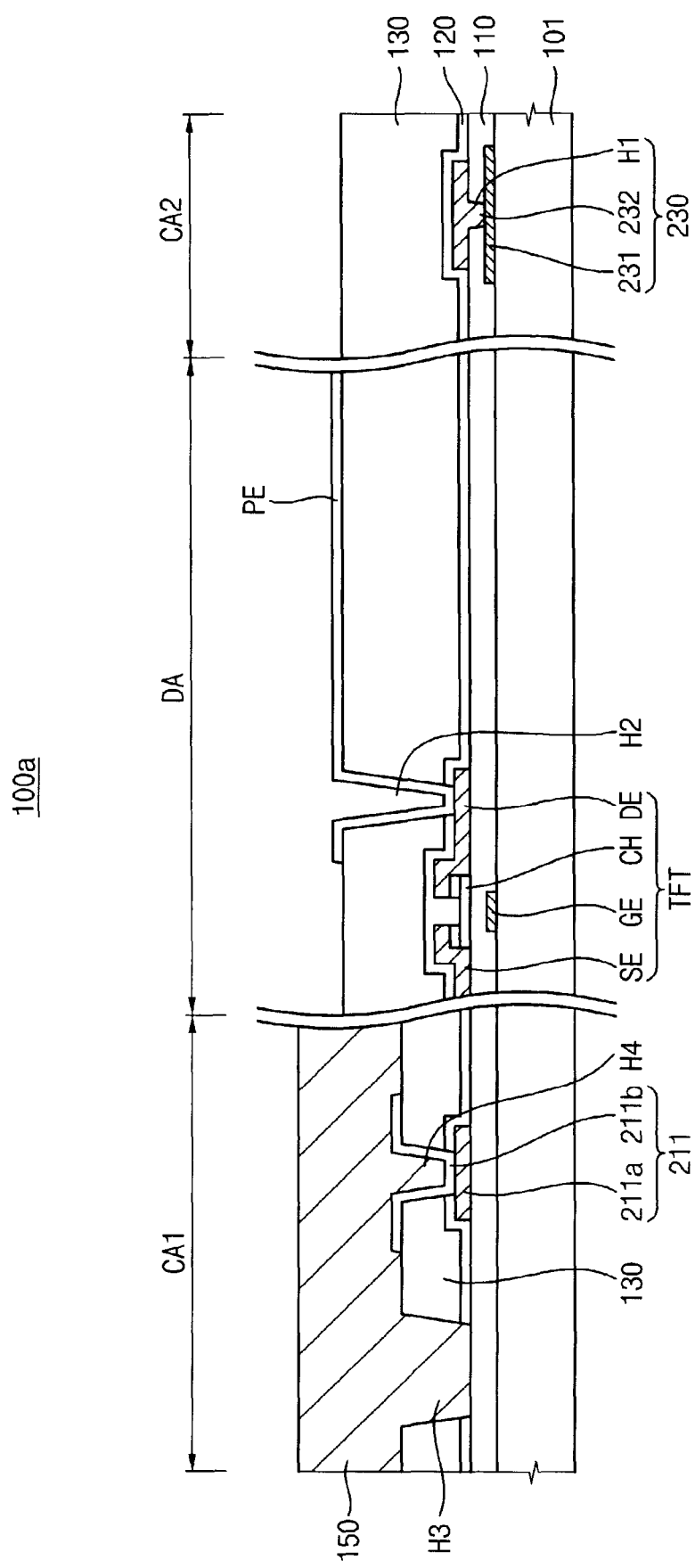

FIGS. 3A, 3B and 3C are partial cross-sectional views illustrating a method of manufacturing the display substrate of FIG. 2 according to the first exemplary embodiment of the present invention.

Referring to FIGS. 1, 2 and 3A, a first metal pattern (not fully shown) including a gate line GL, a gate electrode GE and a gate metal pattern 231 of the gate circuit section 230 is formed on a base substrate 101 using a first metal layer formed on the base substrate 101. Then, a gate insulation layer 110 is formed on the base substrate 101 having the first metal pattern formed thereon.

A channel layer having an activation layer and an ohmic contact layer are formed on the base substrate 101 having the gate insulation layer 110 formed thereon. The activation layer may include a-Si. The ohmic contact layer may include n+ a-Si which is formed by implanting n+ impurities at a high concentration into a-Si. Next, the channel layer is patterned to form a channel part CH overlapping the gate electrode GE on the gate insulation layer 110, as shown in FIG. 3A.

A first hole H1 is formed in the gate metal pattern 231 by patterning the gate insulation layer 110.

Referring now to FIGS. 1, 2 and 3B, a second metal pattern including a data line DL, a source electrode SE, a drain electrode DE, a pad pattern 211a and a source metal pattern 232 of the gate circuit part 230 is formed on the base substrate 101 having the first hole H1 formed thereon using a second metal layer formed on the base substrate 101.

The source metal pattern 232 of the gate circuit part 230 is electrically connected to the gate metal pattern 231 through the first hole H1.

A protective insulation layer 120 and an organic layer 130 are sequentially formed on the base substrate 101 having the second metal pattern formed thereon. Then, the protection layer 120 and the organic layer 130 are patterned using a mask 250.

The mask 250 includes an exposed portion 251, a halftone exposed portion 252 and a light-blocking portion 253. The exposed portion 251 is disposed over a second hole H2 formed in the display area DA and third and fourth holes H3 and H4 formed in the first circuit area CA1. The halftone exposed portion 252 is disposed over the first circuit area CA1 and the light-blocking portion 253 is disposed over an area of the organic layer 130, as shown in FIG. 3B.

Thus, during a patterning process of the protection layer 120 and the organic layer 130 using the mask 250, the exposed portion 251 removes the organic layer 130 and the protective insulation layer 120 to form the second, third and fourth holes H2, H3 and H4, respectively. Further, the halftone exposed portion 252 forms the organic layer 130 on the first circuit area CA1, which is thicker than the organic layer 130 formed in the display area DA and the second circuit area CA2, as discussed above.

Still referring to FIGS. 1, 2 and 3B, the organic layer 130 and the protective insulation layer 120 are removed, and the gate insulation layer 110 is exposed to form the holes of the adhesion part 220. In alternative exemplary embodiments of the present invention, the organic layer 130, the protection layer 120 and the gate insulation layer 110 may be simultaneously removed, and then the base substrate 101 may be exposed to form the holes of the adhesion part 220. Alternatively, the organic layer 130 may be removed, and then the protective insulation layer 120 may be exposed to form the second, third and fourth holes H2, H3 and H4, respectively, of the adhesion part 220.

Referring to FIGS. 1, 2 and 3C, a transparent conductive layer (not fully shown) is formed on the base substrate 101 having the second to fourth holes H2, H3 and H4, respectively, formed thereon. The transparent conductive layer is patterned to form a pixel electrode PE electrically connected to the drain electrode DE through the second hole H2 in the display area DA, and to form the pad electrode 211b electrically connected to the pad pattern 211a through the fourth hole H4 in the first circuit area CA1. Thus, the pad 211 is formed, which includes the pad pattern 211a and the pad electrode 211b.

A conductive adhesion member 150 is formed on the first circuit area CA1 having the pad electrode 211b formed thereon. In an exemplary embodiment, the conductive adhesion member 150 is electrically connected to a source IC mounted in the first circuit area CA1 and the pad electrode 211b. Further, the conductive adhesion member 150 is inserted into the third hole H3 of the adhesion part 220 to make contact with the gate insulation layer 110.

Accordingly, an adhesion force, e.g., a coupling force, between the base substrate 101 and the conductive adhesion member 150 prevents the protective insulation layer 120 and the organic layer 130 from being separated by an external impact, for example, but not being limited thereto.

Figure 4:
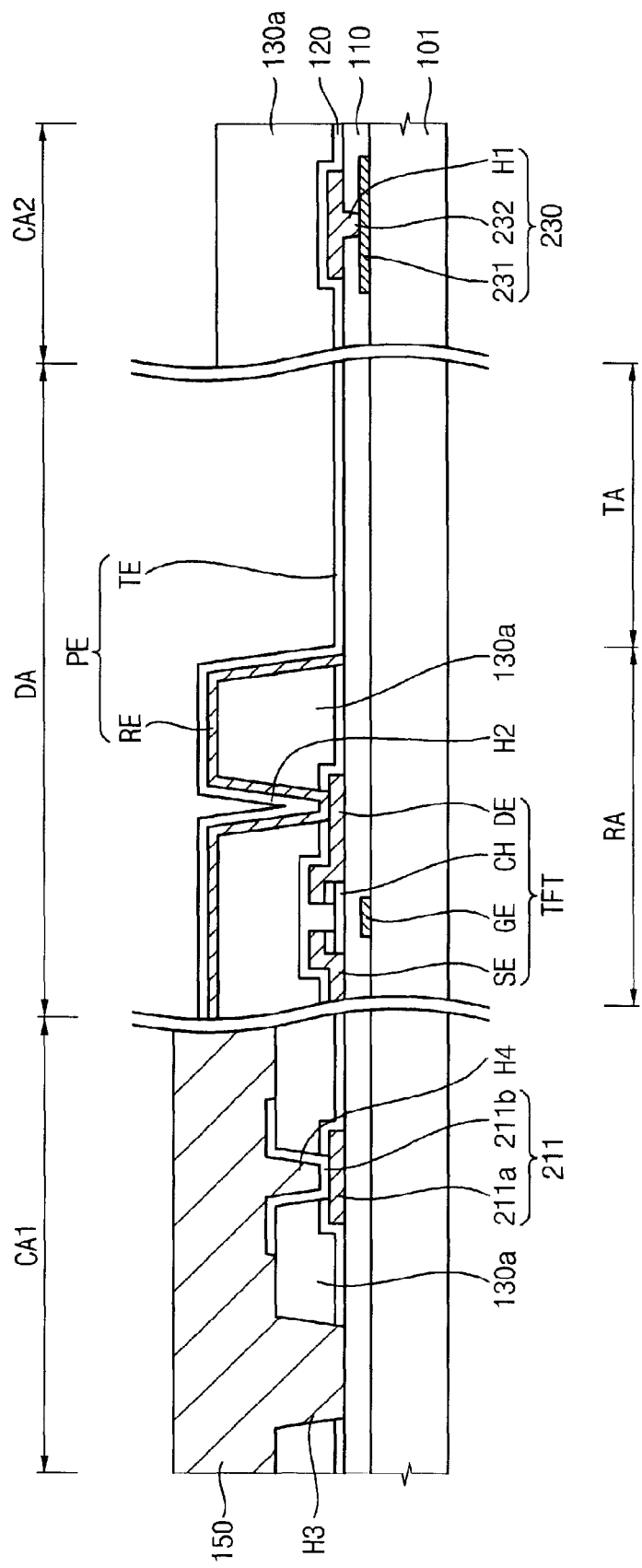
FIG. 4 is a partial cross-sectional view of a display substrate according to a second exemplary embodiment of the present invention.

FIG. 4 is a partial cross-sectional view of a display substrate according to a second exemplary embodiment of the present invention. Hereinafter, the same reference numerals will be used to designate the same or like components as those described in reference to the display substrate 100a according to the first exemplary embodiment of the present invention, and any repetitive description thereof will be omitted.

Referring to FIGS. 1 and 4, a display substrate 100b according to a second exemplary embodiment has a reflective-transmissive structure. For example, the display area DA may include a transmissive area TA and a reflective area RA. An organic layer 130a is formed in the reflective area RA. The pixel electrode PE formed in the display area DA includes a transparent electrode TE formed in the transmissive area TA and a reflective electrode RE formed in the reflective area RA.

An adhesion part 220 including a plurality of holes and a pad part 210 including a plurality of pads 211 are formed in the first circuit area CA1. The adhesion part 220 and the pad part 210 are formed through a patterning of the organic layer 130a. A portion of the organic layer 130a in the reflection area RA is thicker than a portion of the organic layer 130a in the first circuit area CA1, as shown in FIG. 4.

An adhesion part 220 includes a plurality of third holes H3. The plurality of third holes H3 are formed through a patterning of the organic layer 130a and the protective insulation layer 120. In an alternative exemplary embodiment, the plurality of third holes H3 may be formed through a patterning of only the organic layer 130a.

A conductive adhesion layer 150 is formed in the first circuit area CA1, and is electrically connected to a terminal of a source IC (not shown) mounted to the pad 211 in the first circuit area CA1. The conductive adhesion member 150 is inserted into the plurality of third holes H3 of the adhesion part 220 to make contact with a gate insulation layer 110.

Accordingly, an adhesion force between the base substrate 101 and the conductive adhesion layer 150 by the adhesion part 220 enhances an adhesion force between the protective insulation layer 120 and the organic layer 130a.

A gate circuit section 230 is formed in the second circuit area CA2. The gate circuit section 230 includes a gate metal pattern 231 and a source metal pattern 232 formed on the gate metal pattern 231. The gate metal pattern 231 and the source metal pattern 232 are electrically connected to each other through a first hole H1 formed in the gate insulation layer 110. The organic layer 130a is formed on the gate circuit section 230 to prevent corrosion of the gate circuit section 230.

Figure 5A:
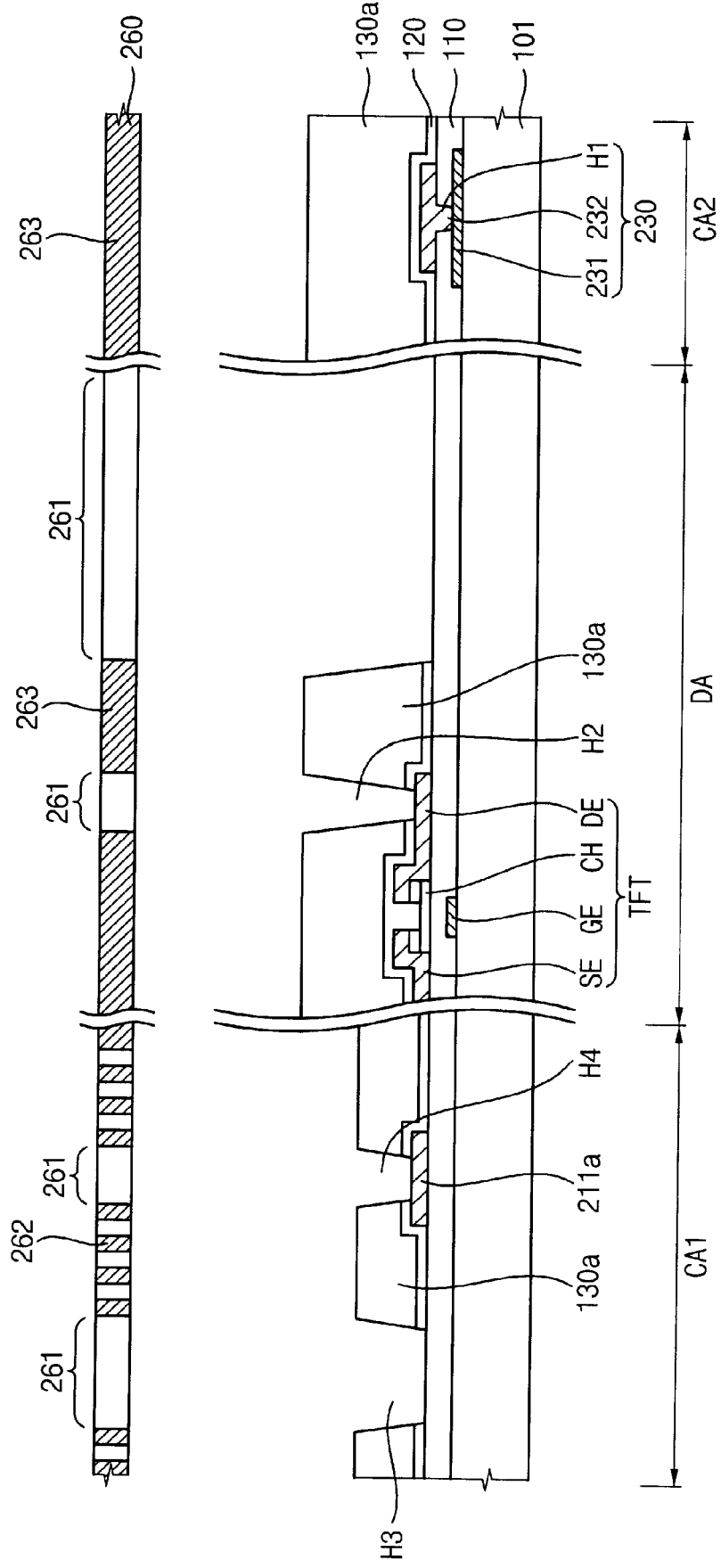
FIGS. 5A and 5B are partial cross-sectional views illustrating a method of manufacturing the display substrate of FIG. 4 according to the second exemplary embodiment of the present invention.
Figure 5B:
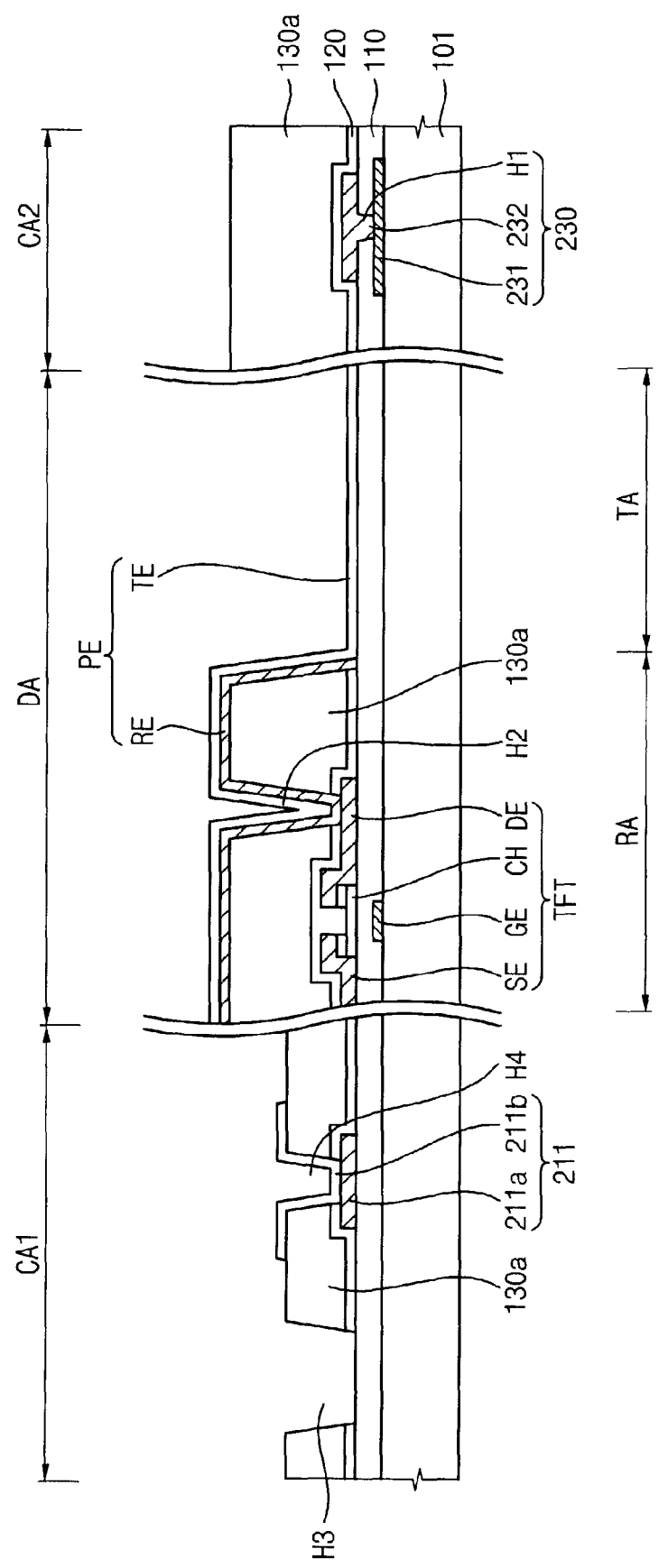

FIGS. 5A and 5B are partial cross-sectional views illustrating a method of manufacturing the display substrate of FIG. 4 according to the second exemplary embodiment of the present invention.

Referring to FIGS. 1, 4, 5A and 5B, a first metal pattern and a second metal pattern is formed on a base substrate 101. A gate line GL, a data line DL and a switching element TFT are formed in a display area DA, a pad pattern 211a is formed in a first circuit area CA1, and a gate circuit section 230 is formed in a second circuit area CA2.

A protective insulation layer 120 and an organic layer 130a are sequentially formed on the base substrate 101 having the first and second metal patterns formed thereon, and then the protective insulation layer 120 and the organic layer 130a are patterned using a mask 260.

The mask 260 includes an exposed portion 261, a halftone exposed portion 262 and a light-blocking portion 263. The exposed portion 261 is disposed over a second hole H2 in the display area DA, a transmissive area TA of the display area DA and a third hole H3 and a fourth hole H4 in the first circuit area.

The halftone exposed portion 262 is disposed over the organic layer 130a in the first circuit area CA1, as shown in FIG. 5A. The light-blocking portion 253 is disposed over a remaining area of the organic layer 130a, for example, the remaining area of the organic layer 130a in the second circuit area CA2, but is not limited thereto.

Thus, during a patterning process of the protection layer 120 and the organic layer 130a using the mask 260, the organic layer 130a and the protective insulation layer 120 are removed to form the second to fourth holes H2, H3 and H4, respectively, and the gate insulation layer 120 is exposed in the transmissive area TA.

A thickness of the organic layer 130a corresponding to the first circuit area CA1 is thinner than that of the organic layer 130a corresponding to the display area DA and the second circuit area CA2 due to the halftone exposed portion 252.

Referring to FIGS. 1, 4 and 5B, a reflective metal layer is formed on the base substrate 101 having the second to fourth holes H2, H3 and H4, respectively, formed thereon. The reflective metal layer is patterned to form a reflective electrode RE of a pixel electrode PE on the organic layer 130a of the reflective area RA. The reflective electrode RE is electrically connected to the drain electrode DE through the second hole H2, as shown in FIG. 5B.

A transparent electrode layer is formed on the base substrate 101 having the reflective electrode RE formed thereon, and then the transparent electrode layer is patterned to form a transmissive electrode TE of the pixel electrode PE and a pad electrode 211B electrically connected to a pad pattern 211a through the fourth hole H4. Thus, a pad 211 including the pad pattern 211a and the pad electrode 211b is formed.

A conductive adhesion member 150 (FIG. 4) is formed on the first circuit area CA1 having the pad electrode 211b formed thereon. The conductive adhesion member 150 is inserted into the third hole H3 of the adhesion part 220 to make contact with the gate insulation layer 110. Accordingly, an adhesion force between the base substrate 101 and the conductive adhesion member 150 by the adhesion part 220 enhances an adhesion force between the protective insulation layer 120 and the organic layer 130a.

Figure 6:
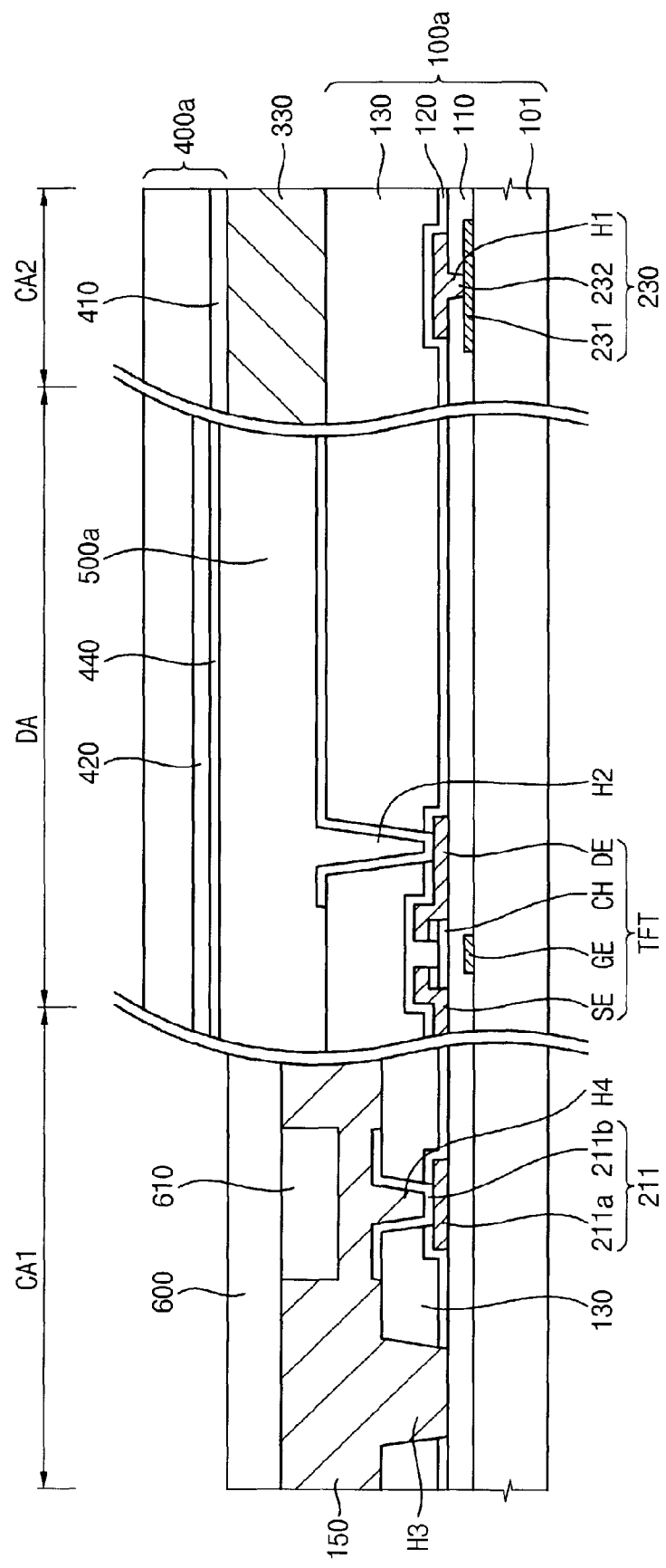
FIG. 6 is a partial cross-sectional view of a display device according to a third exemplary embodiment of the present invention.

FIG. 6 is a partial cross-sectional view of a display device according to a third exemplary embodiment of the present invention.

Referring to FIGS. 1 and 6, a display device according to a third exemplary embodiment includes a display panel and a source IC 600.

The display panel includes a display substrate 100a, an opposing substrate 400a facing the display substrate 100a, and a liquid crystal layer 500a interposed between the display substrate 100a and the opposing substrate 400a. The display substrate 100a is substantially the same as the display substrate in FIG. 2. Thus, the same reference numerals will be used to refer to the same or like components as those described in FIG. 2 and any repetitive explanation concerning the same or like components will be omitted below.

The opposing substrate 400a faces the display substrate 100a. The opposing substrate 400a and the display substrate 100a are combined by a sealing member 330 to receive the liquid crystal layer 500a.

The opposing substrate 400a includes a light-blocking layer 410, a color filter layer 420 and a common electrode layer 440. The light-blocking layer 410 may include a material that blocks light. Further, the light-blocking layer 410 may be formed in an area corresponding to a data line DL and a gate line GL of a display area DA to block leakage light, and may be formed in a peripheral area PA adjacent to the display area DA to enhance a visibility of the display area DA.

The color filter layer 420 is formed in a pixel area of the display area DA defined by a portion of the display area DA not covered by the light-blocking layer 410 to filter transmitted light into light having a color determined by the color filter.

The common electrode layer 440 is an electrode facing the pixel electrode PE of the display substrate 100a to form an electric field in the liquid crystal layer 500a.

The source IC 600 includes a driving chip (not shown) and a flexible printed circuit board ("FPCB") (not shown) for mounting the driving chip. The source IC 600 includes a plurality of terminals 610.

The source IC 600 is mounted on the first circuit area CA1 of the display substrate 100a. A conductive adhesion member 150 formed in the first circuit area CA1 electrically connects to the terminal 610 and a pad 211. The conductive adhesion member 150 may be adhered to the third holes H3 of an adhesion part 220 to enhance an adhesion force between the source IC 600 and the pad 211.

The adhesion force between the adhesion part 220 and the conductive adhesion member 150 prevents a protective insulation layer 120 and an organic layer 130 from being separated by an external impact, for example. Thus, an electrical contact defect between the source IC 600 and the pad 211 is effectively prevented or reduced.

Figure 7:
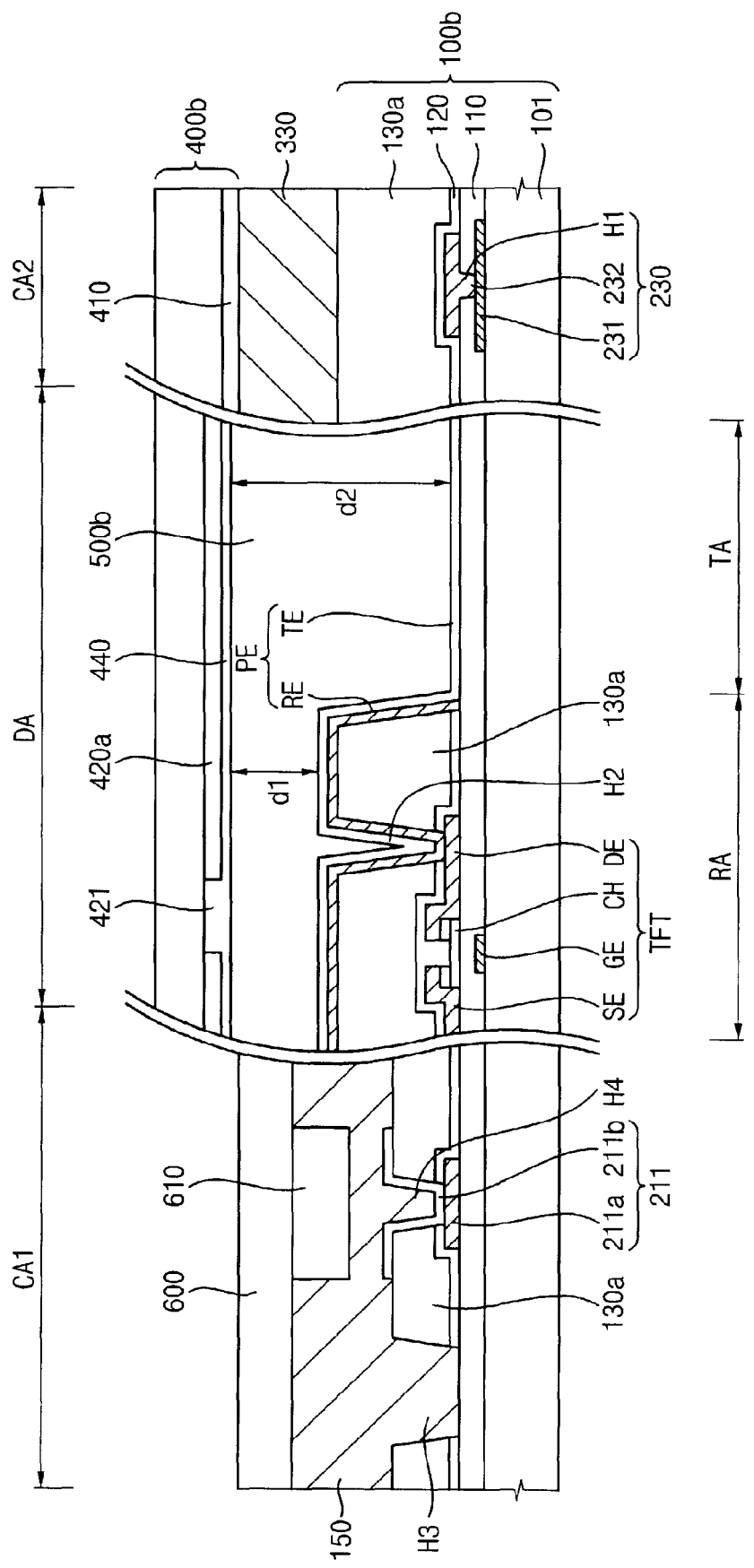
FIG. 7 is a partial cross-sectional view of a display device according to a fourth exemplary embodiment of the present invention.

FIG. 7 is a partial cross-sectional view of a display device according to a fourth exemplary embodiment of the present invention. Hereinafter, the same reference numerals will be used to designate the same or like components as those described in the display substrate according to the third exemplary embodiment described above with reference to FIG. 6, and any repetitive description thereof will be omitted.

Referring to FIGS. 1 and 7, a display device according to a fourth exemplary embodiment includes a display panel and a source IC 600.

The display panel includes a display substrate 100b, an opposing substrate 400b facing the display substrate 100b and a liquid crystal layer 500b interposed between the display substrate 100b and the opposing substrate 400b. The display substrate 100b is substantially the same as the display substrate of FIG. 4 according to the second exemplary embodiment, and thus any repetitive explanation will be omitted. The opposing substrate 400b is disposed to face the display substrate 100b, and is combined with the display substrate 100b by a sealing member 330 to receive the liquid crystal layer 500b.

The opposing substrate 400b includes a color filter layer 420a having a light hole 421 formed thereon for enhancing color reproducibility of a reflective area RA.

The liquid crystal layer 500b has a first cell gap d1 in correspondence with the reflective area RA of the display substrate 100b, and a second cell gap d2 of a transmissive area TA of the display substrate 100b.

In the reflective area RA, when a first light is incident to the liquid crystal layer 500b of the first cell gap d1 through the opposing substrate 400b, the first light has a double transmitting path. More specifically, the first light transmitting through the liquid crystal layer 500b of the first cell gap d1 is reflected by the reflective electrode RE, and then the first light again transmits through the liquid crystal layer 500b of the first cell gap d1.

Alternatively, in the transmissive area TA, when a second light is transmitted through the display substrate 100b incident into the liquid crystal layer 500b of the second cell gap d2, the second light has a single transmitting path.

A length of the second cell gap d2 may be about twice a length of the first cell gap d1.

The source IC 600 is disposed on a first circuit area CA1 of the display substrate 100b. A conductive adhesion member 150 electrically connects to a terminal 610 of the source IC 600 and a pad 211, and may be adhered to a third hole H3 of an adhesion part 220 to enhance an adhesion force between the source IC 600 and the pad 211.

Figure 8:
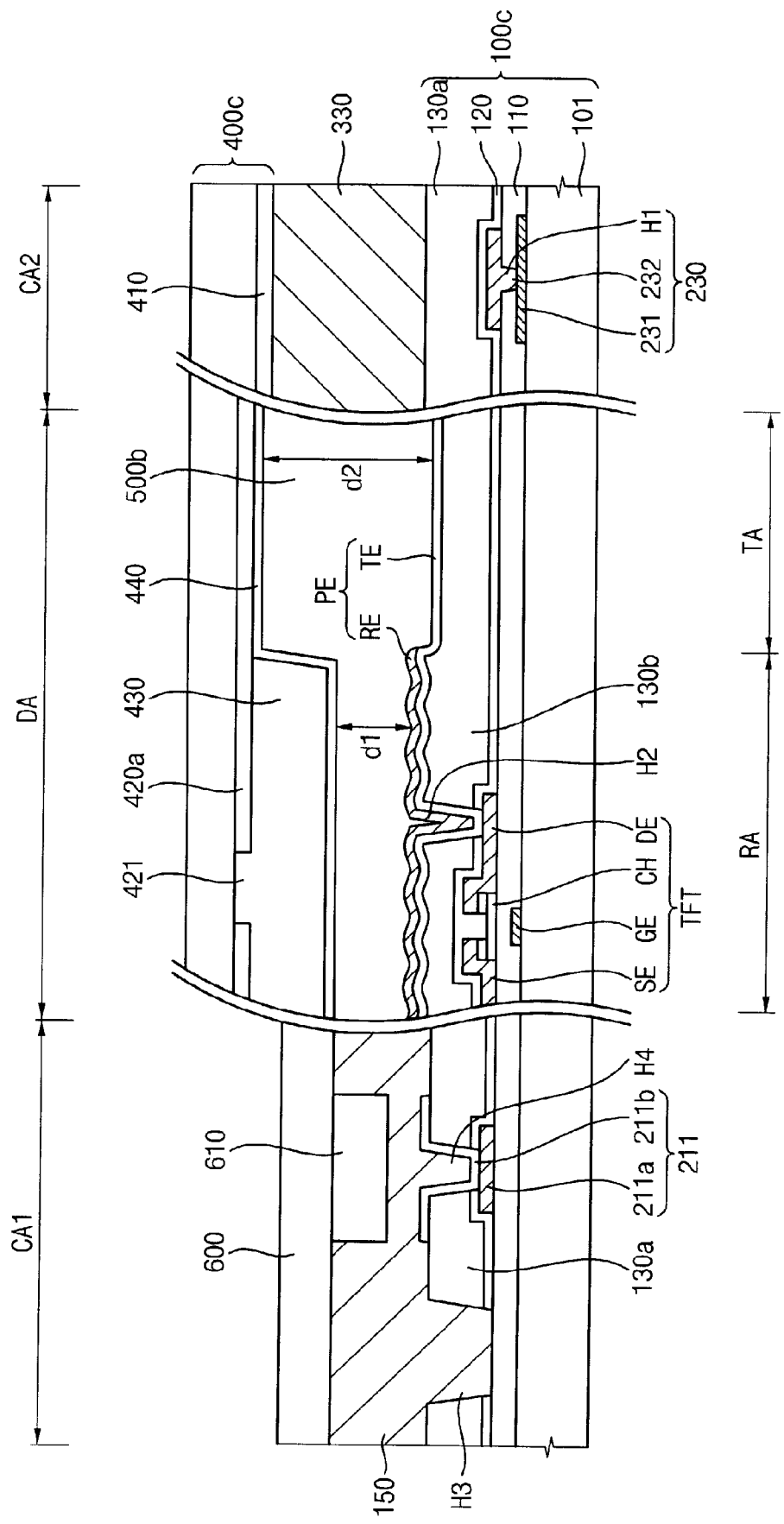
FIG. 8 is a partial cross-sectional view of a display device according to a fifth exemplary embodiment of the present invention.

FIG. 8 is a partial cross-sectional view of a display device according to a fifth exemplary embodiment of the present invention.

Referring to FIGS. 1 and 8, a display device according to a fifth exemplary embodiment includes a display panel and a source IC 600.

The display panel includes a display substrate 100c, an opposing substrate 400c and a liquid crystal layer 500b interposed between the display substrate 100c and the opposing substrate 400c.

The display substrate 100c includes a first organic layer 130a and a second organic layer 130b. The second organic layer 130b is formed to have alternating convex and concave lens patterns (hereinafter collectively referred to as an embossing pattern) formed in a reflective area RA and a flat pattern formed in a transmissive area TA, as shown in FIG. 8. In alternative exemplary embodiments, the second organic layer 130b may be omitted from the transmissive area TA to expose a protective insulation layer 120 or a gate insulation layer 110.

A reflective electrode RE is formed from a reflective metal layer in the reflective area RA. A transparent electrode TE is formed from a transparent electrode layer in the transmissive area TA. For example, the transparent electrode layer may be electrically connected to the switching element TFT, and then the reflective electrode RE is formed on the transparent electrode layer corresponding to the reflective area RA, but is not limited thereto.

The embossing pattern is formed in the second organic layer 130b below the reflective electrode RE. Further, the embossing pattern is formed on the reflective electrode RE to enhance a reflection ratio of the reflective electrode RE.

The opposing substrate 400c includes a color filter layer 420a having a plurality of light holes 421 formed therein and a third organic layer 430. The third organic layer 430 is formed over the reflective area RA, such that the liquid crystal layer 500b has a first cell gap d1 corresponding to the reflective area RA and a second cell gap d2 corresponding to the transmissive area TA.

The source IC 600 is mounted in a first circuit area CA1 of the display substrate 100c. A conductive adhesion layer 150 electrically connects a terminal 610 of the source IC 600 to a pad 211, and may be adhered to the third holes H3 of the adhesion part 220 to enhance an adhesion force between the source IC 600 and the pad 211.

Figure 9:
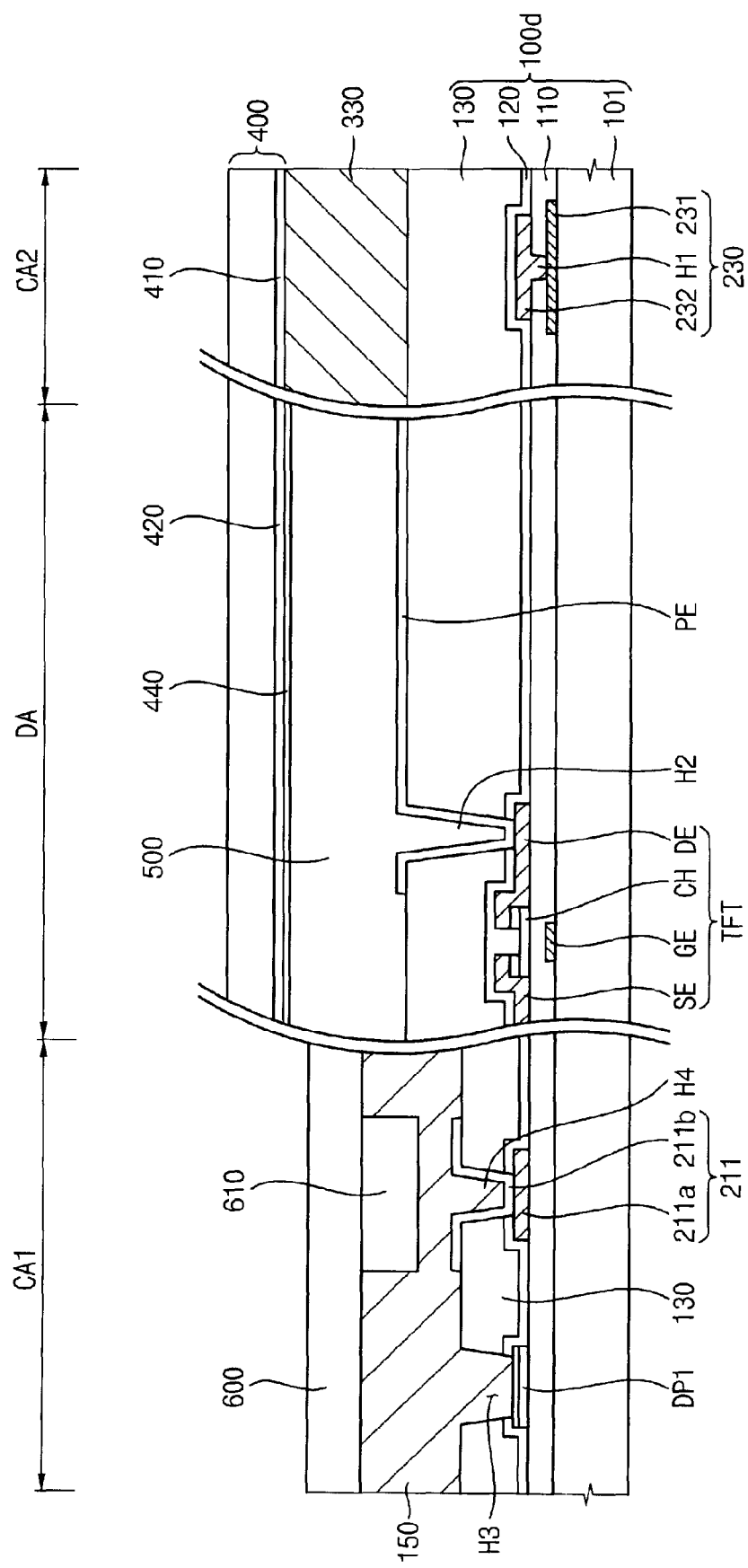
FIG. 9 is a partial cross-sectional view of a display device according to a sixth exemplary embodiment of the present invention.

FIG. 9 is a partial cross-sectional view of a display device according to a sixth exemplary embodiment of the present invention.

Referring to FIGS. 1 and 9, a display device includes a display panel and a source IC 600. The display panel includes a display substrate 100d, an opposing substrate 400 and a liquid crystal layer 500.

The display substrate 100d includes a base substrate 101. A first metal pattern is formed from a first metal layer on the base substrate 101. The first metal pattern includes a plurality of gate lines GL formed in a display area DA and a gate electrode GE of a switching element TFT.

A gate insulation layer 110 is formed on the base substrate 101 having the first metal pattern formed thereon, and a channel layer is formed on the gate insulation layer 110 on the gate electrode GE. The channel layer includes an activation layer and an ohmic contact layer. The activation layer includes a-Si. The ohmic contact layer includes n+ a-Si, e.g., a-Si doped with n-type dopants at a high concentration. The channel layer is patterned to form a channel part CH of the switching element TFT on the gate electrode GE and a dummy pattern DP on a first circuit area CA1.

A second metal pattern formed from a second metal layer is formed on the base substrate 101 having the channel part CH and the dummy pattern DP formed thereon. The second metal pattern includes a plurality of data lines DL, source electrodes SE and drain electrodes DE of the switching element TFT which are formed in a display area DA, and includes a pad pattern 211a formed on the first circuit area CA1 and a source metal pattern 232 of the gate circuit section 230 formed on the second circuit area CA2. The source metal pattern 232 is electrically connected to the gate metal pattern 231 through the first hole H1.

A protective insulation layer 120 and an organic layer 130 are formed on the base substrate 101 having the second metal pattern formed thereon. The organic layer 130 covers the gate circuit section 230 to prevent corrosion of the gate circuit part 230, thereby enhancing a driving reliability.

A second hole H2 is formed in the protective insulation layer 120 and the organic layer 130 to expose a portion of the drain electrode DE. A pixel electrode PE is formed in the display area DA through the second hole H2, which is electrically connected to the drain electrode DE.

A third hole H3 of an adhesion part 220 and a fourth hole H4 exposing the pad pattern 211a are formed in the first circuit area CA1. The third hole H3 of the adhesion part 220 exposes the dummy pattern DP by a patterning of the organic layer 130 and the protective insulation layer 120.

Before the dummy pattern DP is formed, the gate insulation layer 110 is over-etched during an etching process of the protective insulation layer 120 in order to form the third hole H3 of the adhesion part 220. More specifically, about 700 Å of the gate insulation layer 110 is removed by the over-etching process. Therefore, the dummy pattern DP formed corresponding to an area having the third hole H3 formed thereon, in order to prevent an over-etching of the gate insulation layer during an etching of the protective insulation layer 120. A thickness of the dummy pattern DP is thicker than the over-etched thickness. For example, the thickness of the dummy pattern DP1 may be from about 700 Å to about 15,000 Å, but is not limited thereto.

The dummy pattern DP prevents an etching of the gate insulation layer 110 an etching of the protective insulation layer 120 so that the conductive adhesion member 150 makes contact with the dummy pattern DP1 in the third hole H3 and is thereby adhered to the protective insulation layer 120 and the organic layer 130. Therefore, an adhesion force between the display substrate 100d and the conductive adhesion member 150 is enhanced. As a result, an adhesion force between the source IC 600 mounted in the first circuit area CA1 and a pad 211 is enhanced, thereby improving a driving reliability.

A pad electrode 211b is formed through the fourth hole H4, and is electrically connected to the pad pattern 211a. Thus, the pad 211 including the pad pattern 211a and the pad electrode 211b is formed on the first circuit area CA1.

A thickness of the organic layer 130 corresponding to the first circuit area CA1 may be thinner than a thickness of the organic layer 130 formed in the display area DA, as shown in FIG. 9, so that a step height between the third and fourth holes H3 and H4 may be minimized.

The opposing substrate 400 includes a light-blocking layer 410, a color filter layer 420 and a common electrode layer 440.

The light-blocking layer 410 may include a material which blocks light. Further, the light-blocking layer 410 may be formed in an area corresponding to the data lines DL and the gate lines GL of the display area DA to block leakage light, and may also be formed in the peripheral area PA adjacent to the display area DA to enhance a visibility of the display DA.

The color filter layer 420 is formed in a pixel area of the display area DA defined by a portion of the display area DA not covered by the light-blocking layer 410 to filter transmitted light into light having a color determined by the color filter. The common electrode layer 440 is an electrode facing the pixel electrode PE of the display substrate 100d to form an electric field in a liquid crystal layer 500.

The source IC 600 includes a driving chip (not shown) and an FPCB (not shown) for mounting the driving chip. The source IC 600 includes a plurality of terminals 610.

The source IC 600 is mounted on the first circuit area CA1 of the display substrate 100d. The conductive adhesion layer 150 formed in the first circuit area CA1 electrically connects to the terminal 610 and the pad 211. The conductive adhesion member 150 is adhered to the third holes H3 of the adhesion part 220 to enhance an adhesion force between the source IC 600 and the pad 211, as discussed above.

Therefore, an adhesion force between the adhesion part 220 and the conductive adhesion member 150 prevents the protective insulation layer 120 and the organic layer 130 from being separated by an external impact, for example. Thus, an electrical contact defect between the source IC 600 and the pad 211 is effectively reduced or prevented.

Figure 10:
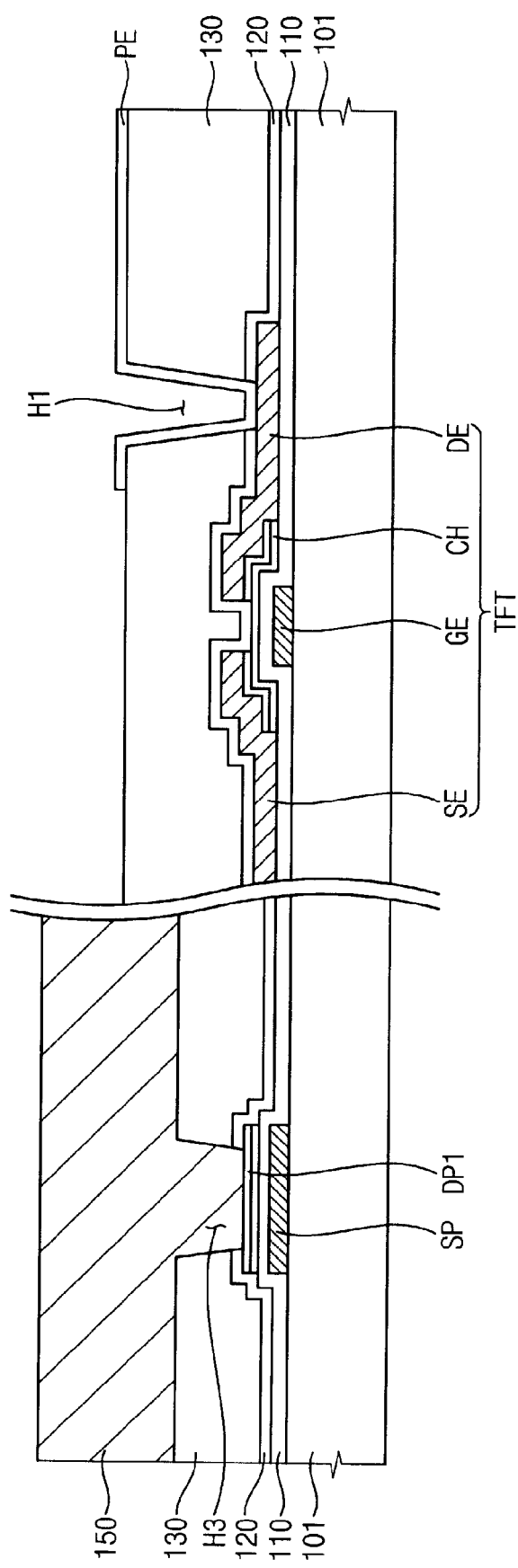
FIG. 10 is a partial cross-sectional view of a display substrate according to a seventh exemplary embodiment of the present invention.

FIG. 10 is a partial cross-sectional view of a display substrate according to a seventh exemplary embodiment of the present invention.

Referring to FIGS. 9 and 10, a display substrate 100e may further include a step compensation pattern SP formed below the dummy pattern DP1. The step compensation pattern SP is formed from the first metal layer and the step compensation pattern SP is included in the first metal pattern. The step compensation pattern SP decreases a step height of the organic layer 130 formed on the third hole H3.

The step height of the organic layer 130 is compensated for by the step compensation pattern SP, so that an adhesion force between the dummy pattern DP1 and the conductive adhesion member 150 through the third hole H3 may be enhanced.

Figure 11:
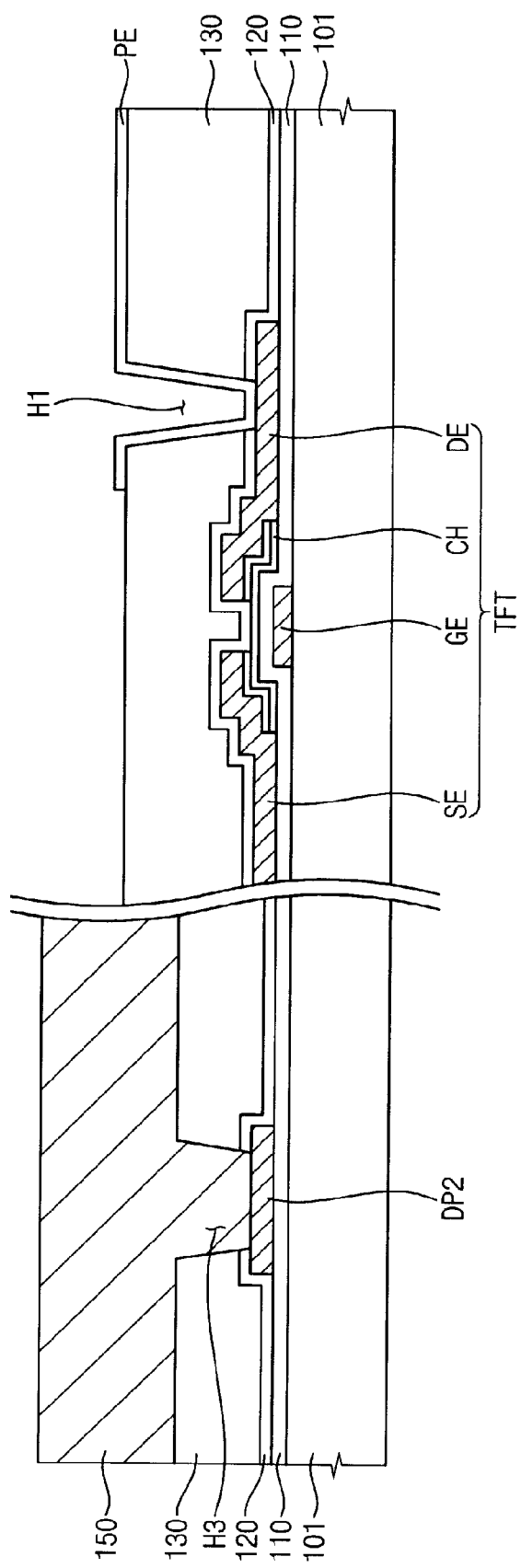
FIG. 11 is partial a cross-sectional view of a display substrate according to an eighth exemplary embodiment of the present invention.

FIG. 11 is a partial cross-sectional view of a display substrate according to an eighth exemplary embodiment of the present invention.

Referring to FIGS. 1 and 11, an adhesion part 220 including a third hole H3 is formed in a first circuit area CA1 of a display substrate 100f. The third hole H3 of the adhesion part 220 is formed by patterning a protective insulation layer 120 and an organic layer 130 to expose a dummy pattern DP2. The dummy pattern DP2 is formed from a second metal layer, so that the second metal pattern includes the dummy pattern DP2.

A conductive adhesion layer 150 is adhered to the dummy pattern DP2, the protective insulation layer 120 and the organic layer 130 through the third hole H3 of the adhesion part 220, enhancing an adhesion force between the conductive adhesion layer 150 and the base substrate 101. Further, an adhesion force between the dummy pattern DP2 formed from the second metal layer and the conductive adhesion member 150 may be superior, due to a superior characteristic of an adhesion force between a metal material and an organic material. Accordingly, an adhesion force between the organic layer 130 and the protective insulation layer 120 is enhanced.

As a result, an adhesion force between a source IC (not shown) mounted in a first circuit area CA1 and the pad 211 is enhanced, thereby improving a driving reliability.

Figure 12:
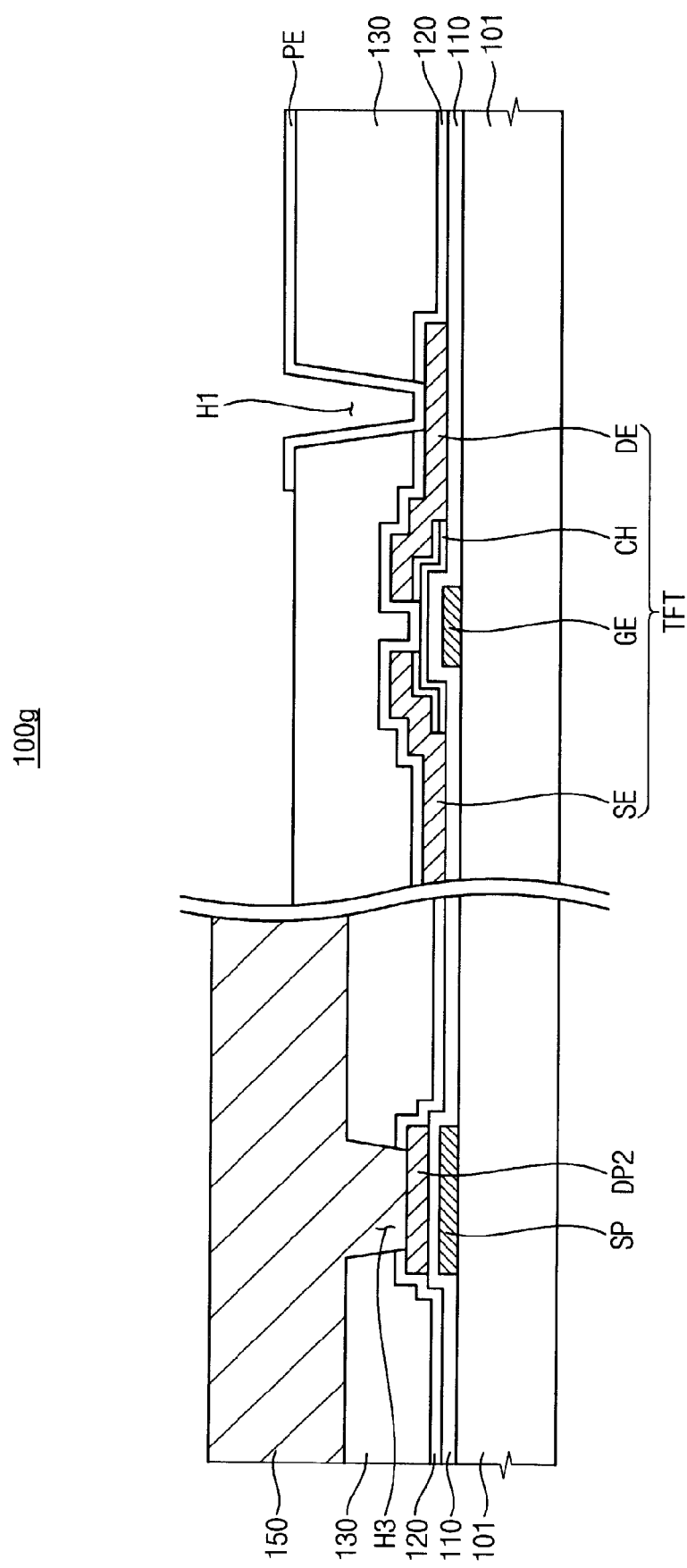
FIG. 12 is a partial cross-sectional view of a display substrate according to a ninth exemplary embodiment of the present invention.

FIG. 12 is a partial cross-sectional view of a display substrate according to a ninth exemplary embodiment of the present invention.

Referring to FIGS. 11 and 12, a display substrate 100g further includes a step compensation pattern SP formed below a dummy pattern DP2.

The step compensation pattern SP is included in a first metal pattern formed from a first metal layer. The step compensation pattern SP decreases a step height of an organic layer 130 formed in a third hole H3. The step height of the organic layer 130 is compensated for by the step compensation pattern SP, so that an adhesion force between the dummy pattern DP2 and a conductive adhesion layer 150 through the third hole H3 may be further enhanced.

Figure 13:
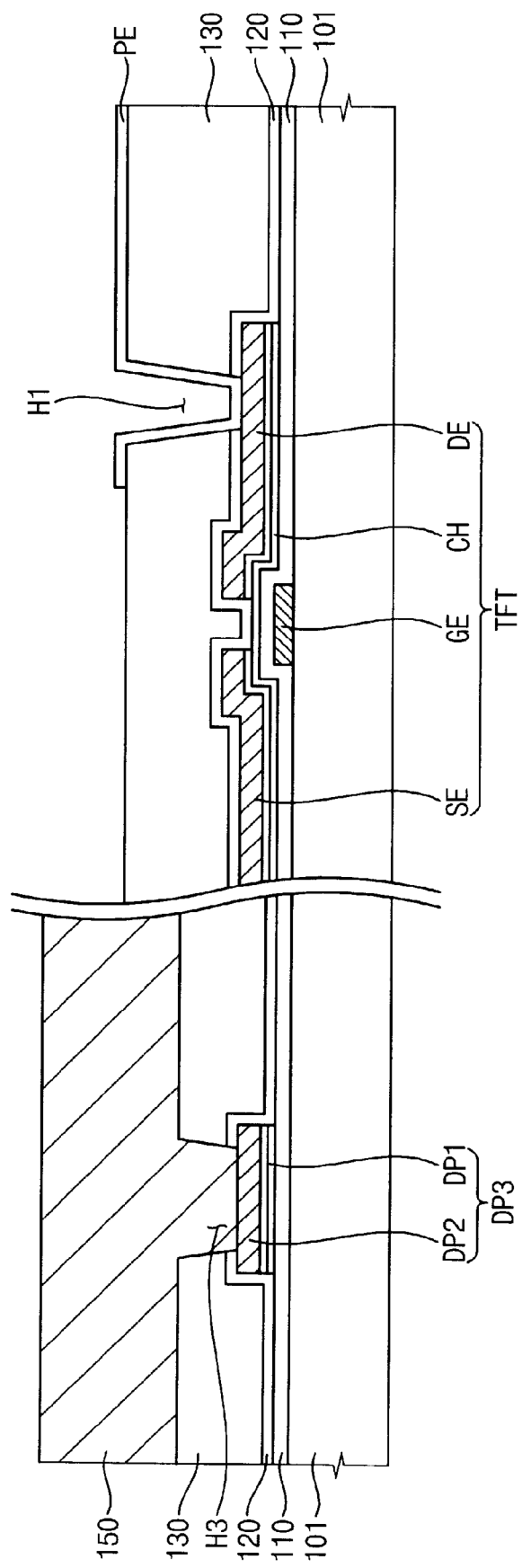
FIG. 13 is a partial cross-sectional view of a display substrate according to a tenth exemplary embodiment of the present invention.

FIG. 13 is a partial cross-sectional view of a display substrate according to a tenth exemplary embodiment of the present invention.

Referring to FIGS. 1 and 13, an adhesion part 220 including a third hole H3 is formed in a first circuit area CA1 of a display substrate 100h. The third hole H3 of the adhesion part 220 is formed by patterning a protective insulation layer 120 and an organic layer 130 to expose a dummy pattern DP3. The dummy pattern DP3 has a multilayer structure including a first dummy pattern DP1 and a second dummy pattern DP2 which is formed on the first dummy pattern DP1. The first dummy pattern DP1 is formed from a channel layer. The second dummy pattern DP2 is formed from a second metal layer. The dummy pattern DP3 is formed by a simultaneous patterning using one mask of the channel layer and the second metal layer.

Therefore, a conductive adhesion layer 150 adheres to the second dummy pattern DP2 of the dummy pattern DP3 and is then adhered to the protective insulation layer 120 and the organic layer 130. Further, an adhesion force between the second dummy pattern DP2 formed from the second metal layer and the conductive adhesion member 150 is superior, due to superior characteristic of an adhesion force between a metal material and an organic material, as discussed above. Accordingly, an adhesion force between the organic layer 130 and the protective insulation layer 120 is enhanced.

As a result, an adhesion force between a source IC (not shown) mounted in a first circuit area CA1 and a pad 211 is enhanced, thereby improving a driving reliability.

A data line DL, a source electrode DI and a drain electrode DE of a switching element TFT, which are formed in a display area DA of the display substrate 100h, are formed by patterning using one mask using the channel layer and the second metal layer. Therefore, the data line DL, the source electrode SE and the drain electrode DE have a multilayer structure including the channel layer and the second metal layer which is formed on the channel layer.

Figure 14:
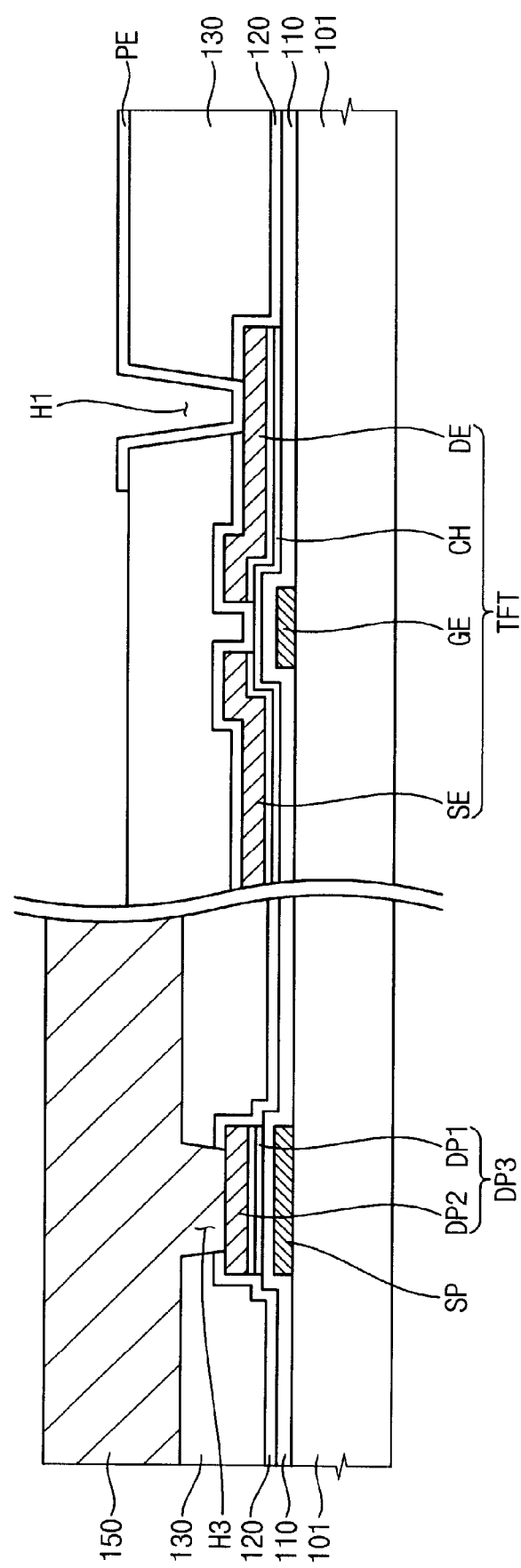
FIG. 14 is a partial cross-sectional view of a display substrate according to an eleventh exemplary embodiment of the present invention.

FIG. 14 is a partial cross-sectional view of a display substrate according to an eleventh exemplary embodiment of the present invention.

Referring to FIGS. 13 and 14, a display substrate 100i may further include a step compensation pattern SP formed below the dummy pattern DP3. The step compensation pattern SP is included in a first metal pattern formed from a first metal layer. The step compensation pattern SP decreases a step height of an organic layer 130 formed in a third hole H3. The step height of the organic layer 130 is compensated for by the step compensation pattern SP, so that an adhesion force between the dummy pattern DP3 and a conductive adhesion layer 150 through the third hole H3 is further enhanced.

Finally, the dummy pattern and the step compensation pattern as shown in FIGS. 9 to 14 may be adopted in the display devices according to the second to fifth exemplary embodiments of the present invention as described above in reference to FIGS. 4 to 8.

According to exemplary embodiments of the present invention described herein, an adhesion part including a plurality of holes is formed adjacent to a pad part, so that an adhesion force of an IC electrically connected through the pad part and the adhesion member is enhanced.

The present invention should not be construed as being limited to the exemplary embodiments set forth herein. Rather, these exemplary embodiments are provided so that this disclosure will be thorough and complete and will fully convey the concept of the present invention to those skilled in the art.

For example, a lower insulation layer of a display substrate such as a gate insulation layer or a protective insulation layer may make contact with a conductive adhesion layer through the adhesion part, thereby enhancing an adhesion force between the organic layer and the protective insulation layer. Thus, an electrical contact defect, induced by the organic layer being separated from the protective insulation layer, between the IC and the pad part is effectively reduced or prevented.

Although the present invention has been particularly shown and described with reference to exemplary embodiments thereof, it will be understood by those of ordinary skill in the art that various changes and modifications in form and details may be made therein without departing from the spirit and scope of the present invention as defined by the following claims.

What is claimed is:

1. A display substrate comprising:
    a base substrate having a display area and a peripheral area which surrounds the display area;
    a pixel electrode formed on the display area;
    a pad part formed on the peripheral area;
    an adhesion part formed on the peripheral area and having a plurality of holes formed in an area adjacent to the pad part on the peripheral area; and
    a conductive adhesion member formed on the peripheral area and formed on the pad part and the adhesion part, the conductive adhesion member electrically connected to the pad part and a terminal of an integrated circuit, the conductive adhesion member filling the holes.

2. The display substrate of claim 1, further comprising:
    a first insulation layer formed on the base substrate; and
    an organic layer formed on the first insulation layer.

3. The display substrate of claim 2, wherein individual holes of the plurality of holes are formed through a portion of the organic layer in the peripheral area, and
    the conductive adhesion member is adhered to the first insulation layer exposed through the individual holes.

4. The display substrate of claim 2, further comprising a second insulation layer formed on the base substrate.

5. The display substrate of claim 4, wherein individual holes of the plurality of holes are formed through a portion of the organic layer and the first insulation layer formed in the peripheral area, and
    the conductive adhesion member is adhered to the second insulation layer exposed through the individual holes.

6. The display substrate of claim 4, wherein individual holes of the of plurality of holes are formed by a simultaneous patterning of the organic layer and the first insulation layer formed in the peripheral area, and
    the display substrate further comprises a dummy pattern exposed by each of the individual holes.

7. The display substrate of claim 6, further comprising a switching element including a channel layer electrically connected to the pixel electrode formed from a first metal layer, and a source electrode and a drain electrode formed from a second metal layer.

8. The display substrate of claim 7, wherein the dummy pattern is formed by a patterning of the channel layer.

9. The display substrate of claim 7, wherein the dummy pattern is formed by a patterning of the second metal layer.

10. The display substrate of claim 7, wherein the dummy pattern is a multilayer structure formed by a patterning of the channel layer and a patterning of the second metal layer.

11. The display substrate of claim 7, further comprising a stepped compensation pattern formed on the base substrate.

12. The display substrate of claim 11, wherein the stepped compensation pattern is formed by a patterning of the first metal layer.

13. The display substrate of claim 4, wherein individual holes of the plurality of holes are formed by a simultaneous patterning of a portion of the organic layer formed in the peripheral area, the first insulation layer and the second insulation layer, and
    the conductive adhesion member is adhered to the second insulation layer exposed through the individual holes.

14. The display substrate of claim 2, wherein the pixel electrode comprises a transparent electrode and a reflective electrode.

15. The display substrate of claim 14, wherein the organic layer is formed over the reflective electrode.

16. The display substrate of claim 15, wherein the organic layer has a concave pattern and a convex pattern formed thereon.

17. The display substrate of claim 2, wherein:
    a first portion of the organic layer having a first thickness is formed in the peripheral area having the pad part, a second portion of the organic layer having a second thickness is formed in the display area having the pixel electrode formed thereon, and the second thickness of the second portion of the organic layer is greater than the first thickness of the first portion of the organic layer.

18. The display substrate of claim 2, further comprising a gate circuit section formed on the peripheral area.

19. The display substrate of claim 18, wherein a portion of the organic layer formed on the peripheral area covers the gate circuit section.

20. A display substrate comprising:
a base substrate having a display area and a peripheral area which surrounds the display area;
a pixel electrode formed on the display area;
a pad part formed on the peripheral area;
a circuit part formed on the peripheral area and having a plurality of holes formed in an area adjacent to the pad part on the peripheral area; and
an integrated circuit mounted on the circuit part, having a terminal electrically connected to the pad part.

21. The display substrate of claim 20, further comprising:
a first insulation layer formed on the base substrate; and
an organic layer formed on the first insulation layer.

22. The display substrate of claim 21, wherein individual holes of the plurality of holes are formed through a portion of the organic layer in the peripheral area.

23. The display substrate of claim 21, further comprising a second insulation layer formed on the base substrate.

24. The display substrate of claim 23, wherein individual holes of the plurality of holes are formed through a portion of the organic layer and the first insulation layer formed in the peripheral area.

25. The display substrate of claim 24, further comprising a dummy pattern being exposed by each of the holes.

26. The display substrate of claim 25, further comprising a switching element including a channel layer electrically connected to the pixel electrode formed from a first metal layer, and a source electrode and a drain electrode formed from a second metal layer.

27. The display substrate of claim 26, wherein the dummy pattern is formed by a patterning of the channel layer.

28. The display substrate of claim 26, wherein the dummy pattern is formed by a patterning of the second metal layer.

29. The display substrate of claim 26, wherein the dummy pattern has a multilayer structure and is formed by a patterning of the channel layer and a patterning of the second metal layer.

30. The display substrate of claim 26, further comprising a stepped compensation pattern formed on the base substrate.

31. The display substrate of claim 30, wherein the stepped compensation pattern is formed by a patterning of the first metal layer.

32. The display substrate of claim 23, wherein individual holes of the plurality of holes are formed by a simultaneous patterning of the organic layer formed in the peripheral area, the first insulation layer and the second insulation layer.

33. The display substrate of claim 21, wherein the pixel electrode comprises a transparent electrode and a reflective electrode.

34. The display substrate of claim 33, wherein the organic layer is formed over the reflective electrode.

35. The display substrate of claim 34, wherein the organic layer has a concave pattern and a convex pattern formed thereon.

36. The display substrate of claim 21, wherein:
a first portion of the organic layer having a first thickness is formed in the peripheral area having the pad part,
a second portion of the organic layer having a second thickness is formed in the display area having the pixel electrode formed thereon, and
the second thickness of the second portion of the organic layer is greater than the first thickness of the first portion of the organic layer.

37. The display substrate of claim 21, further comprising a gate circuit section formed on the peripheral area.

38. The display substrate of claim 37, wherein a portion of the organic layer formed on the peripheral area covers the gate circuit section.

39. A method of manufacturing a display substrate, the method comprising:
forming a switching element in a display area of a base substrate;
forming a pad pattern in a peripheral area surrounding the display area of the base substrate;
forming an organic layer on the base substrate;
patterning the organic layer to form an adhesion part on a portion of the peripheral area adjacent to the pad pattern, the adhesion part having a plurality of holes formed therein;
forming a pixel electrode on the base substrate;
electrically connecting the pixel electrode to the switching element and a pad electrode electrically connected to the pad pattern; and
forming a conductive adhesion member on the peripheral area and formed on the pad electrode and the adhesion part, the conductive adhesion member being electrically connected to the pad electrode and a terminal of an integrated circuit, the conductive adhesion member filling the holes.

40. The method of claim 39, further comprising forming a first insulation layer on the base substrate.

41. The method of claim 40, wherein the conductive adhesion member is adhered to the first insulation layer exposed through individual holes of the plurality of holes.

42. The method of claim 40, further comprising forming a second insulation layer on the base substrate.

43. The method of claim 42, wherein the forming the adhesion part includes simultaneously patterning the organic layer and the first insulation layer.

44. The method of claim 43, wherein the conductive adhesion member adheres to the second insulation layer exposed through the holes.

45. The method of claim 40, further comprising forming a gate circuit part in the peripheral area.

46. The method of claim 45, wherein forming the organic layer forms a portion of the organic layer to cover the gate circuit section.

47. A display device comprising:
a display panel comprising:
a base substrate;
a display substrate formed on the base substrate and having a display area and a peripheral area;
an opposing substrate facing the display substrate;
a pixel electrode formed on the display area;
a pad part formed on the peripheral area;
an adhesion part formed on the peripheral area and having a plurality of holes formed in an area adjacent to the pad part on the peripheral area;
a conductive member formed on the peripheral area and formed on the pad part and the adhesion part, the conductive member filling the holes; and an integrated circuit including a terminal, the terminal electrically connected to the pad part through the conductive member.

48. The display device of claim 47, wherein the display substrate further comprises:
a first insulation layer formed on the base substrate; and
a first organic layer formed on the first insulation layer.

49. The display device of claim 48, wherein individual holes of the plurality of holes are formed through a portion of the first organic layer in the peripheral area, and the conductive adhesion member is adhered to the first insulation layer exposed through the individual holes.

50. The display device of claim 48, further comprising a second insulation layer formed on the base substrate.

51. The display device of claim 50, wherein the individual holes of the plurality of holes are formed through a portion of the first organic layer in the peripheral area and a portion of the first insulation layer, and
the conductive adhesion member is adhered to the second insulation layer exposed through the individual holes.

52. The display device of claim 50, wherein the holes are formed by a simultaneous patterning of the first organic layer formed in the peripheral area and the first insulation layer, and
the display substrate further comprises a dummy pattern exposed by each of the individual holes.

53. The display device of claim 52, further comprising a switching element including a channel layer electrically connected to the pixel electrode formed from a first metal layer, and a source electrode and a drain electrode formed from a second metal layer.

54. The display device of claim 53, wherein the dummy pattern is formed by a patterning of the channel layer.

55. The display device of claim 53, wherein the dummy pattern is formed by a patterning of the second metal layer.

56. The display device of claim 53, wherein the dummy pattern is a multilayer structure and is formed through a patterning of the channel layer and the second metal layer.

57. The display device of claim 53, further comprising a stepped compensation pattern formed on the base substrate.

58. The display device of claim 57, wherein the stepped compensation pattern is formed by a patterning of the first metal layer.

59. The display device of claim 50, wherein the individual holes of the plurality of holes are formed by a simultaneous patterning of the organic layer formed in the peripheral area, the first insulation layer and the second insulation layer, and
the conductive adhesion member is adhered to the second insulation layer exposed through the individual holes.

60. The display device of claim 48, wherein the pixel electrode comprises a transparent electrode and a reflective electrode.

61. The display device of claim 60, wherein the first organic layer is formed over the reflective electrode.

62. The display device of claim 61, wherein the first organic layer has a concave pattern and a convex pattern formed thereon.

63. The display device of claim 60, wherein the color filter layer has a light hole formed therein, wherein the light hole is formed over the reflective electrode.

64. The display device of claim 63, wherein the opposing substrate further comprises a second organic layer formed over the reflective electrode of the pixel electrode on the display area of the display substrate.

65. The display device of claim 48, wherein:
a first portion of the first organic layer having a first thickness is formed in the peripheral area having the pad part,
a second portion of the organic layer having a second thickness is formed in the display area having the pixel electrode formed thereon, and
the second thickness of the second portion of the first organic layer is greater than the first thickness of the first portion of the first organic layer.

* * * * *